United States Patent
Noda

(10) Patent No.: US 8,450,735 B2
(45) Date of Patent: May 28, 2013

(54) SEMICONDUCTOR DEVICE INCLUDING A TRANSISTOR, AND MANUFACTURING METHOD OF SEMICONDUCTOR DEVICE

(75) Inventor: Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 88 days.

(21) Appl. No.: 12/868,295

(22) Filed: Aug. 25, 2010

(65) Prior Publication Data

US 2011/0049518 A1 Mar. 3, 2011

(30) Foreign Application Priority Data

Sep. 2, 2009 (JP) ................. 2009-202449

(51) Int. Cl.
*H01L 29/04* (2006.01)
*H01L 31/20* (2006.01)

(52) U.S. Cl.
USPC ............. 257/57; 257/59; 257/72; 257/43; 438/158

(58) Field of Classification Search
USPC ............ 257/57, 59, 72, E21.704, E21.46, 257/E29.296; 438/158
See application file for complete search history.

(56) References Cited

U.S. PATENT DOCUMENTS

| | | |
|---|---|---|
| 4,862,234 A | 8/1989 | Koden |
| 5,021,850 A | 6/1991 | Tanaka et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |

(Continued)

FOREIGN PATENT DOCUMENTS

| | | |
|---|---|---|
| EP | 1 737 044 A1 | 12/2006 |
| EP | 1 770 788 A2 | 4/2007 |

(Continued)

OTHER PUBLICATIONS

International Search Report, PCT Application No. PCT/JP2010/063446, dated Oct. 19, 2010, 4 pages.

(Continued)

*Primary Examiner* — Theresa T Doan
(74) *Attorney, Agent, or Firm* — Fish & Richardson P.C.

(57) ABSTRACT

An object is to prevent contamination of a semiconductor film in a transistor or a semiconductor device including the transistor. Another object is to suppress variation in electrical characteristics and deterioration. A transistor including: a gate electrode layer provided over a substrate; a gate insulating film provided over the gate electrode layer; a semiconductor layer which is provided over the gate insulating film and which overlaps the gate electrode layer; a carbide layer provided over and in contact with a surface of the semiconductor layer; and a source electrode layer and a drain electrode layer which are electrically connected to the semiconductor layer is provided.

25 Claims, 17 Drawing Sheets

U.S. PATENT DOCUMENTS

| | | | |
|---|---|---|---|
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,420,209 B2 * | 9/2008 | Suzawa et al. | 257/59 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,923,311 B2 | 4/2011 | Zhang et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosona et al. | |
| 2005/0127380 A1 | 6/2005 | Kawasaki et al. | |
| 2005/0140265 A1 | 6/2005 | Hirakata | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0093703 A1 * | 4/2008 | Yang et al. | 257/529 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197350 A1 | 8/2008 | Park et al. | |
| 2008/0203387 A1 | 8/2008 | Kang et al. | |
| 2008/0224133 A1 | 9/2008 | Park et al. | |
| 2008/0224147 A1 | 9/2008 | Nagata et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308806 A1 | 12/2008 | Akimoto et al. | |
| 2009/0008638 A1 | 1/2009 | Kang et al. | |
| 2009/0068773 A1 | 3/2009 | Lai et al. | |
| 2009/0073325 A1 | 3/2009 | Kuwabara et al. | |
| 2009/0076322 A1 | 3/2009 | Matsunaga et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0180045 A1 | 7/2009 | Yoon et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0278122 A1 | 11/2009 | Hosono et al. | |
| 2009/0280600 A1 | 11/2009 | Hosono et al. | |
| 2010/0003783 A1 | 1/2010 | Akimoto | |
| 2010/0038639 A1 | 2/2010 | Akimoto | |
| 2010/0051937 A1 | 3/2010 | Kaji et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0207117 A1 | 8/2010 | Sakata et al. | |
| 2010/0207118 A1 * | 8/2010 | Sakata et al. | 257/43 |
| 2010/0207119 A1 | 8/2010 | Sakata et al. | |
| 2010/0308324 A1 | 12/2010 | Kim et al. | |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-027771 A | 1/1990 |
| JP | 05-251705 A | 9/1993 |
| JP | 07-326756 A | 12/1995 |
| JP | 08-264794 A | 10/1996 |
| JP | 11-505377 A | 5/1999 |
| JP | 11-274504 A | 10/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073705 A | 3/2007 |
| JP | 2007-096055 A | 4/2007 |
| JP | 2007-123861 A | 5/2007 |
| JP | 2007-150158 A | 6/2007 |
| JP | 2007-165861 A | 6/2007 |
| JP | 2009-089351 A | 4/2009 |
| JP | 2009-170905 A | 7/2009 |
| WO | 2004/114391 A1 | 12/2004 |
| WO | 2007/058329 A1 | 5/2007 |
| WO | 2008105250 A1 | 9/2008 |

OTHER PUBLICATIONS

Written Opinion, PCT Application No. PCT/JP2010/063446, dated Oct. 19, 2010, 5 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] At Temperatures Over 1000° C," Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-inch) XGA AMLCD Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID Inrternational Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IgZo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nomura et al.; "Room-Temperature Fabrication of Transparent Flexible Thin-Film Transistors Using Amorphous Oxide Semiconductors"; Nature; Nov. 25, 2004; vol. 432; pp. 488-492.

Prins et al.; "A Ferroelectric Transparent Thin-Film Transistor"; Appl. Phys. Lett. (Applied Physics Letters); Jun. 17, 1996; vol. 68; No. 25; pp. 3650-3652.

Nakamura et al.; "The phase relations in the In2O3-Ga2ZnO4-ZnO system at 1350°C"; Journal of Solid State Chemistry; Aug. 1, 1991; vol. 93; No. 2; pp. 298-315.

Kimizuka et al.; "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System"; Journal of Solid State Chemistry; Apr. 1, 1995; vol. 116; No. 1; pp. 170-178.

Nakamura et al.; "Syntheses and crystal structures of new homologous compounds, indium iron zinc oxides (InFeO3 (ZnO)m) (m natural number) and related compounds"; Kotai Butsuri (Solid State Physics); 1993; vol. 28; No. 5; pp. 317-327.

Nomura et al.; "Thin-Film Transistor Fabricated in Single-Crystalline Transparent Oxide Semiconductor"; Science; May 23, 2003; vol. 300; No. 5623; pp. 1269-1272.

* cited by examiner

| Calculation model | D (cm²/sec) |
|---|---|
| a-Si:H | $9.6 \times 10^{-8}$ |
| a-SiC:H | $9.5 \times 10^{-11}$ |

FIG. 17A
FIG. 17B
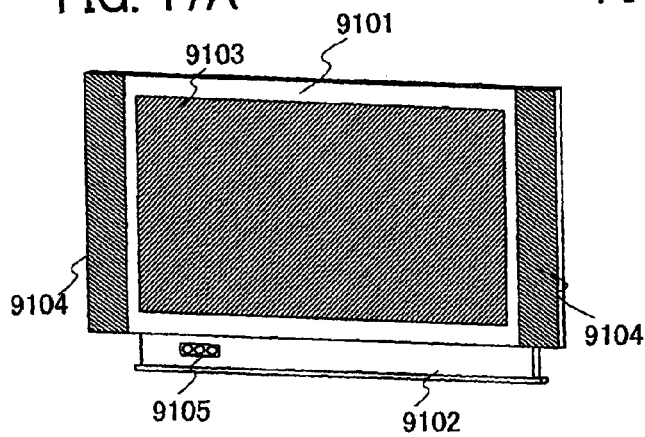
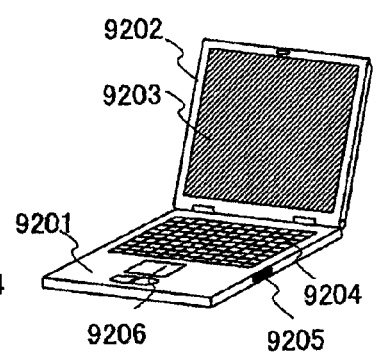
FIG. 17C
FIG. 17D
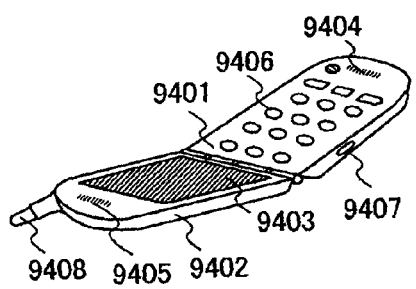
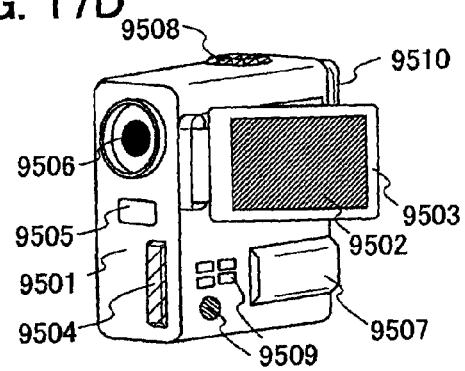
FIG. 17E
FIG. 17F
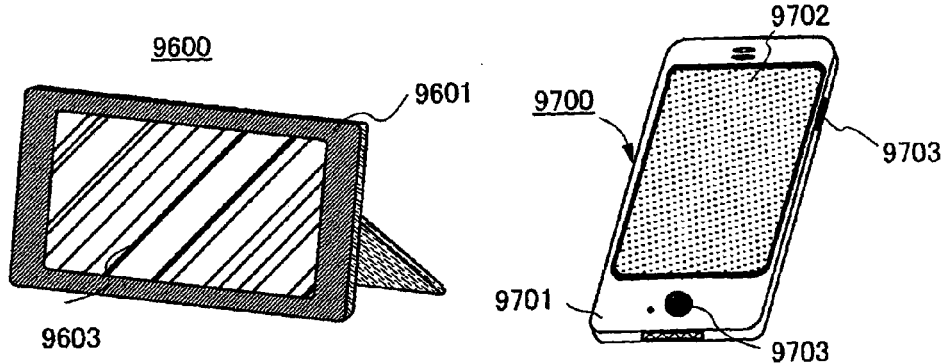

SEMICONDUCTOR DEVICE INCLUDING A TRANSISTOR, AND MANUFACTURING METHOD OF SEMICONDUCTOR DEVICE

TECHNICAL FIELD

The present invention relates to a transistor, a semiconductor device including the transistor, and methods for manufacturing the transistor and the semiconductor device. Further, the present invention relates to a display device including the transistor. For example, the present invention relates to an electro-optic device typified by a liquid crystal display device or the like and an electronic appliance including such a display device as a component.

BACKGROUND ART

In recent years, a technique for forming thin film transistors using a semiconductor thin film (with a thickness of several tens to several hundreds of nanometers) formed over a substrate having an insulating surface has attracted attention. Thin film transistors have been widely applied to electronic devices such as ICs or display devices. In particular, development as a switching element of a display device typified by a liquid crystal display device has been urgently developed.

In display devices such as liquid crystal display devices, amorphous silicon thin film transistors have been in practical use as switching elements. Channel-etched inversed staggered (or bottom-gate) TFTs including a channel formation region formed using amorphous silicon have been used in many cases.

A back-channel portion of an inversed staggered thin film transistor is exposed to a variety of work environment during the manufacture of the thin film transistor. For example, due to dry etching in a process for manufacturing the thin film transistor, plasma damage is caused or a fixed charge is generated in some cases. Further, moisture or an impurity adheres to or penetrates the back-channel portion after the manufacture of the thin film transistor in some cases. Change in qualities or contamination of the back-channel portion of the thin film transistor increases off current, leading to variation in characteristics and deterioration of the thin film transistor.

In order to reduce in off current of the thin film by removing an impurity of the back-channel portion, a technique in which the impurity adhered to the surface of back-channel portion is removed by surface treatment which i-type layer amorphous silicon in the back-channel portion between a source electrode and a drain electrode is subjected to plasma discharge under an atmosphere gas containing $H_2$ or He has been disclosed (see Patent Document 1).

REFERENCE

Patent Document

[Patent Document 1] Japanese Published Patent Application No. H11-274504

DISCLOSURE OF INVENTION

However, the characteristics of the thin film transistor cannot be sufficiently stabilized by only surface treatment of the back-channel portion of the thin film transistor. This is because a chemically and thermally stable surface cannot be formed by only plasma treatment or the like performed on the surface of the semiconductor film. Although it is known that a silicon oxide film or a silicon nitride film is used as a protection film on the back-channel side of the thin film transistor, such a protection film adversely affects a semiconductor film that is easily damaged by plasma in some cases.

In view of the above-described problems, it is an object of one embodiment of the present invention to suppress change in semiconductor characteristics in a transistor or a semiconductor device including the transistor. It is another object of one embodiment of the present invention to improve the reliability of the semiconductor device.

In order to solve the above-described problems, one embodiment of the present invention has a structure in which a carbide layer that is chemically or thermally stable and dense is formed over and in contact with a surface of a semiconductor layer. Specifically, one embodiment of the present invention is a transistor including: a gate electrode layer provided over a substrate; a gate insulating film provided over the gate electrode layer; a semiconductor layer which is provided over the gate insulating film and which overlaps the gate electrode layer; a carbide layer provided over and in contact with a surface of the semiconductor layer; and a source electrode layer and a drain electrode layer which are electrically connected to the semiconductor layer. The carbide layer serves as a protective layer which prevents atoms or the like that causes change in semiconductor characteristics from being in contact with or entering the semiconductor layer. The carbide layer also serves as a protective layer of a semiconductor layer in the manufacturing process. Further, deterioration, change in qualities or the like of the carbide layer can be suppressed even when the carbide layer is exposed to various chemical solutions or the like in the manufacturing process because the carbide layer is a chemically stable film. Furthermore, the carbide layer is also a thermally stable film; thus, at the interface between the semiconductor layer and the carbide layer, change in semiconductor characteristics can be suppressed when the carbide layer is heated.

In the above structure, the carbide layer is provided over and in contact with part of the surface of the semiconductor layer, and the source electrode layer and the drain electrode layer are provided over and in contact with the surfaces of the semiconductor layer where the carbide layer is not provided. Alternatively, in the above structure, a first low resistance layer serving as a source region is provided in a region where the semiconductor layer is in contact with the source electrode layer; and a second low resistance layer serving as a drain region is provided in a region where the semiconductor layer is in contact with the drain electrode layer.

One embodiment of the present invention is a transistor including: a gate electrode layer provided over a substrate; a gate insulating film provided over the gate electrode layer; a semiconductor layer provided over the gate insulating film; a source electrode layer and a drain electrode layer which are electrically connected to the semiconductor layer; and a carbide layer provided in contact with the semiconductor layer, the source electrode layer, and the drain electrode layer.

One embodiment of the present invention is a transistor including: a gate electrode layer provided over a substrate; a gate insulating film provided over the gate electrode layer; a source electrode layer and a drain electrode layer provided over the gate insulating film; a semiconductor layer which is provided over the source electrode layer and the drain electrode layer and over the gate electrode layer with the gate insulating film provided therebetween; and a carbide layer provided over and in contact with the surface of the semiconductor layer.

In the above structures, a first low resistance layer serving as a source region is provided in a region where the semiconductor layer is in contact with the source electrode layer; and a second low resistance layer serving as a drain region is provided in a region where the semiconductor layer is in contact with the drain electrode layer.

In the above structures, the carbide layer is formed using at least one of materials of silicon carbide, silicon nitride carbide, germanium carbide, n-type silicon carbide, and p-type silicon carbide.

One embodiment of the present invention provides a method for manufacturing a transistor, including the steps of: forming a gate electrode layer over a substrate; forming a gate insulating film over the gate electrode layer; forming a semiconductor layer over the gate insulating film so as to overlap the gate electrode layer; forming a carbide film so as to cover the semiconductor layer; forming a carbide layer by etching the carbide film; forming a conductive film over the carbide layer and the semiconductor layer; and forming a source electrode layer and a drain electrode layer by etching the conductive film.

One embodiment of the present invention provides a method for manufacturing a transistor, including the steps of: forming a gate electrode layer over a substrate; forming a gate insulating film over the gate electrode layer; forming a semiconductor layer over the gate insulating film so as to overlap the gate electrode layer; forming a conductive film over the semiconductor layer; forming a source electrode layer and a drain electrode layer by etching the conductive film; and forming a carbide film so as to cover the semiconductor layer, the source electrode layer, and the drain electrode layer.

One embodiment of the present invention provides a method for manufacturing a transistor, including the steps of: forming a gate electrode layer over a substrate; forming a gate insulating film over the gate electrode layer; forming a conductive film over the gate insulating film; forming a source electrode layer and a drain electrode layer by etching the conductive film; forming a semiconductor layer over the source electrode layer and the drain electrode layer with the gate insulating film provided therebetween; and forming a carbide layer over the surface of the semiconductor layer.

Examples of a semiconductor layer in this specification include a semiconductor material formed of a Group 14 element such as silicon, germanium, or silicon germanium, a compound semiconductor material such as InGaAs, InGaP, or InGaN, and an oxide semiconductor material including zinc oxide, tin oxide, or indium oxide. The crystallinity of the semiconductor layer may be either single crystal or non-single-crystal (e.g., polycrystalline, microcrystalline, or amorphous). Note that the semiconductor layer may include two or more crystal structures among the above crystal structures (e.g., an amorphous structure and a microcrystalline structure (or a polycrystalline structure)).

In this specification, a semiconductor device refers to any device which can function by utilizing semiconductor characteristics, and a display device, a semiconductor circuit, and an electronic appliance are all included in the category of the semiconductor device. In addition, in this specification, a display device includes a light-emitting device and a liquid crystal display device in its category. The light-emitting device includes a light-emitting element, and the liquid crystal display device includes a liquid crystal element. A light-emitting element includes, in its category, an element whose luminance is controlled by current or voltage, and specifically includes an inorganic electroluminescent (EL) element, an organic EL element, an LED element, and the like.

In one embodiment of the present invention, a carbide layer is provided in contact with a semiconductor layer, so that change in semiconductor characteristics of a semiconductor device can be suppressed. Further, the reliability of the semiconductor device can be increased.

BRIEF DESCRIPTION OF DRAWINGS

In the accompanying drawings:

FIGS. 17A to 17F illustrate examples of semiconductor devices according to Embodiment 7.

BEST MODE FOR CARRYING OUT THE INVENTION

Figure 1A:
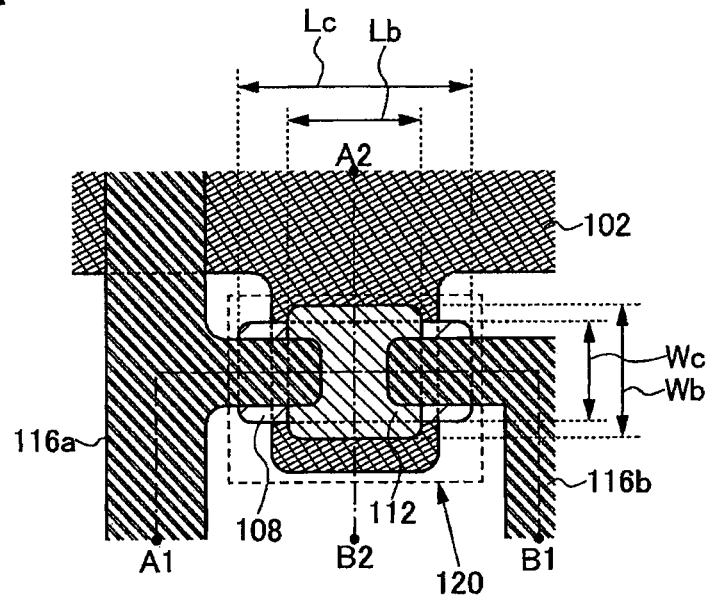
FIGS. 1A to 1C illustrate a structure of a transistor according to Embodiment 1.

Embodiments of the present invention are described in detail below with reference to the accompanying drawings. The present invention is not limited to the following description of the embodiments. It is easily understood by those skilled in the art that modes and details of the present invention can be changed in various ways without departing from the spirit and scope of the present invention. Therefore, the present invention should not be limited to the descriptions of the embodiment modes and the embodiment below. Further, structures according to different embodiments can be implemented in combination as appropriate. In the structures of the invention described below, the same portions or portions having similar functions are denoted by the same reference numerals, and repetitive description thereof is omitted.

Embodiment 1

In this embodiment, structures and manufacturing methods of semiconductor devices according to one embodiment of the present invention are described with reference to FIGS. 1A to 1C, FIGS. 2A and 2B, FIGS. 3A and 3B, FIGS. 4A and 4B, FIGS. 5A and 5B, FIGS. 6A to 6D, FIGS. 7A and 7B, and FIG. 8.

Figure 1B:
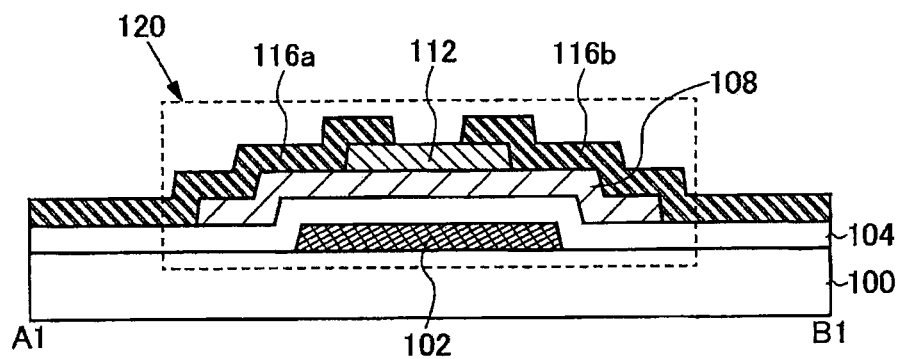
Figure 1C:
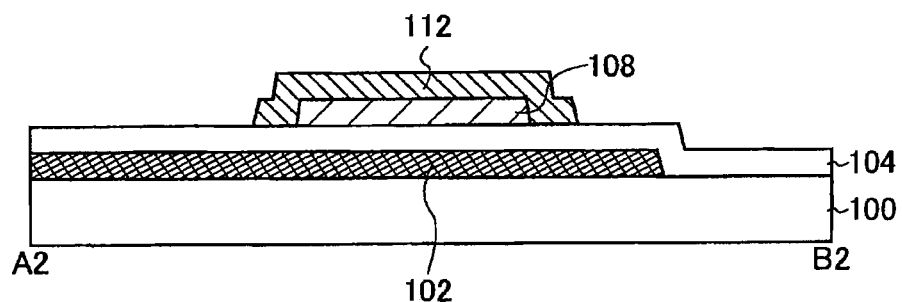

FIG. 1A is a top view, FIG. 1B is a cross-sectional view taken along line A1-B1 of FIG. 1A, and FIG. 1C is a cross-sectional view taken along line A2-B2 of FIG. 1A.

First, structures of the transistor of this embodiment are described. A transistor 120 illustrated in FIGS. 1A to 1C includes a gate (including a gate wiring and a gate electrode layer (hereinafter referred to as a "gate electrode layer 102")) provided over a substrate 100, a gate insulating film 104 provided over the gate electrode layer 102, a semiconductor layer 108 provided over the gate insulating film 104, a carbide layer 112 provided over and in contact with a surface of the semiconductor layer 108, and a source (including a source wiring and a source electrode (hereinafter referred to as a "source electrode layer 116a")) and a drain (including a drain wiring and a drain electrode (hereinafter referred to as a "drain electrode layer 116b")) which are electrically connected to the semiconductor layer 108 (see FIGS. 1A to 1C).

The semiconductor layer 108 is provided so that at least part thereof overlaps the gate electrode layer 102 with the gate insulating film 104 provided therebetween, and the semiconductor layer 108 serves as a layer for forming a channel region of the transistor 120 (a channel layer).

For the semiconductor layer 108, a semiconductor formed of a Group 14 element such as silicon, germanium, silicon germanium, or silicon carbide, a compound semiconductor such as InGaAs, InGaP, or InGaN, an oxide semiconductor such as zinc oxide or tin oxide, or the like may be used. The crystallinity of the semiconductor layer 108 may be either single crystal or non-single-crystal (e.g., polycrystalline, microcrystalline, or amorphous). Note that the semiconductor layer 108 may include two or more crystal structures among the above crystal structures (e.g., an amorphous structure and a microcrystalline structure (or the polycrystalline structure)).

The carbide layer 112 is provided over and in contact with the surface of the semiconductor layer 108 at least in a region that overlaps the gate electrode layer 102. In addition, the carbide layer 112 can be provided over and in contact with part of the surface of the semiconductor layer 108, and the source electrode layer 116a and the drain electrode layer 116b can be provided in contact with regions of the semiconductor layer 108, over which the carbide layer 112 is not provided. Here, an example where the regions of the semiconductor layer 108, over which the carbide layer 112 is not provided, are provided apart from each other and the source electrode layer 116a and the drain electrode layer 116b are provided in contact with the regions is described.

As a formation method of the carbide layer 112, a CVD method, a sputtering method, or the like can be used. The thickness of the carbide layer 112 can be set to greater than or equal to 1 nm and less than or equal to 500 nm, preferably greater than or equal to 10 nm and less than or equal to 100 nm.

In the case where the source electrode layer 116a and the drain electrode layer 116b are provided over the semiconductor layer 108, the carbide layer 112 can serve as a channel protective layer (a channel stop layer). In the case where the carbide layer 112 is made to actively serve as a channel protective layer, the carbide layer 112 is preferably formed as a dense film. A dense film can prevent an impurity that causes change in semiconductor characteristics from being in contact with or entering the semiconductor layer 108. Further, deterioration, change in qualities or the like of the carbide layer can be suppressed even when the carbide layer is exposed to various chemical solutions or the like in the manufacturing process because the carbide layer is a chemically stable film. Furthermore, the carbide layer is also a thermally stable film, and thus, change in the state can be suppressed when the interface between the semiconductor layer and the carbide layer is heated. As compared to the case where the carbide layer 112 is not provided in contact with the semiconductor layer 108, change in semiconductor characteristics caused by exposure of the semiconductor layer 108 can be suppressed.

The carbide layer 112 may be provided in contact with a surface of at least a region in which a channel is formed in the semiconductor layer 108. In addition, a silicon oxide film, a silicon oxynitride film, a silicon nitride film, or a silicon nitride oxide film may be formed as a protective insulating film over the carbide layer 112. The protective insulating film over the carbide layer 112 can be formed by a sputtering method or a CVD method.

In FIGS. 1A to 1C, the source electrode layer 116a serves as a source of the transistor 120, and the drain electrode layer 116b serves as a drain of the transistor 120. Depending on the driving method of the transistor 120, the source electrode layer 116a might serve as a drain and the drain electrode layer 116b might serve as a source.

In the structure illustrated in FIGS. 1A to 1C, a silicon carbide layer can be used as the carbide layer 112 which is provided over and in contact with the surface of the semiconductor layer 108. Silicon nitride carbide, germanium carbide, or the like may be used other than silicon carbide. Alternatively, an impurity imparting one conductivity type may be added to the silicon carbide. For example, n-type silicon carbide including an impurity element imparting n-type conductivity such as phosphorus or arsenic, or p-type silicon carbide including an impurity element imparting p-type conductivity such as boron, aluminum, or gallium can be used. The carbide layer 112 can be formed using one or combination of the above-mentioned materials.

The crystallinity of the carbide layer 112 may be either single crystal or non-single-crystal (e.g., polycrystalline, microcrystalline, or amorphous). The carbide layer 112 may include two or more crystal structures among the above crystal structures (e.g., an amorphous structure and a microcrystalline structure (or a polycrystalline structure)). In this specification, the case where the crystallinity of the carbide layer is amorphous is described.

Next, the shapes of the semiconductor layer 108 and the carbide layer 112 in the structure illustrated in FIGS. 1A to 1C are described. Note that in the description below, the width of the carbide layer 112 (Wb) and the width of the semiconductor layer 108 (Wc) indicate the length of the carbide layer 112 and the length of the semiconductor layer 108 in the channel width direction, respectively. Further, the length of the carbide layer 112 (Lb) and the length of the semiconductor layer 108 (Lc) indicate the length of the carbide layer 112 and the length of the semiconductor layer 108 in the channel length direction, respectively. Furthermore, the channel length direction indicates the direction which is substantially parallel to the direction in which carriers move in the transistor 120 (the direction in which the source electrode layer 116a and the drain electrode layer 116b are connected to each other), and the channel width direction indicates the direction which is substantially perpendicular to the channel length direction.

The transistor illustrated in FIGS. 1A to 1C is a transistor in the case where the width of the carbide layer 112 (Wb) is larger than the width of the semiconductor layer 108 (Wc) and the carbide layer 112 is provided to extend beyond (to cross) both edges of the semiconductor layer 108 in the channel width direction. In addition, the length of the carbide layer 112 (Lb) is smaller than the length of the semiconductor layer 108 (Lc). Further, two regions which are not covered with the carbide layer 112 are provided in the channel length direction, and the source electrode layer 116a and the drain electrode layer 116b are provided over the two regions that are apart from each other so as to be electrically connected. In this manner, leakage current caused by change in semiconductor characteristics at the surface of the semiconductor layer 108 can be reduced.

Figure 2A:
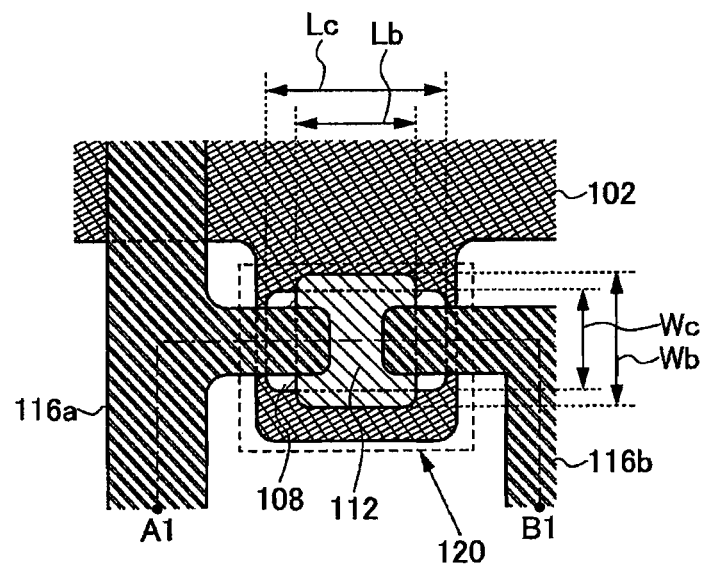
FIGS. 2A and 2B illustrate a structure of a transistor according to Embodiment 1.
Figure 2B:
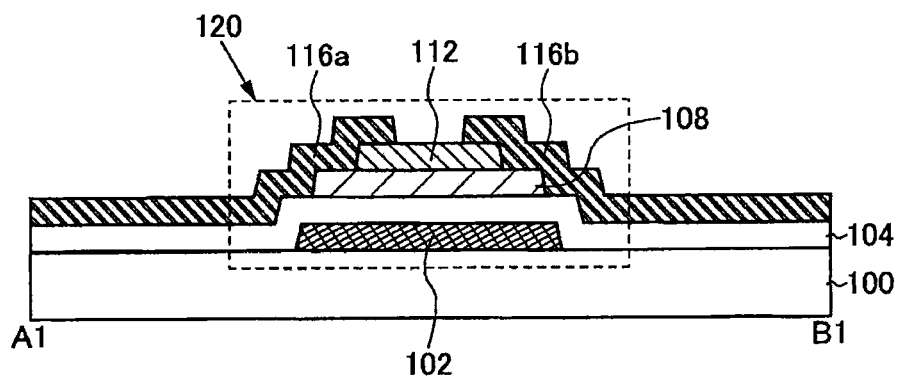
Figure 3A:
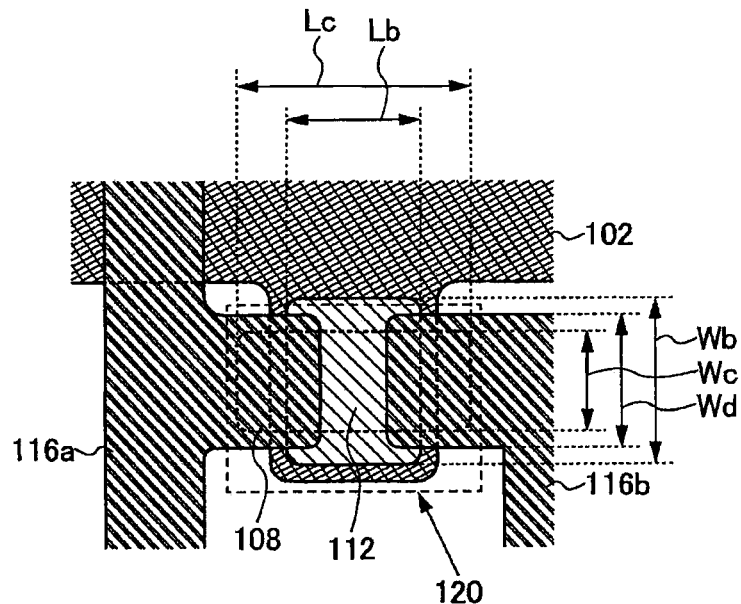
FIGS. 3A and 3B each illustrate a structure of a transistor according to Embodiment 1.
Figure 3B:
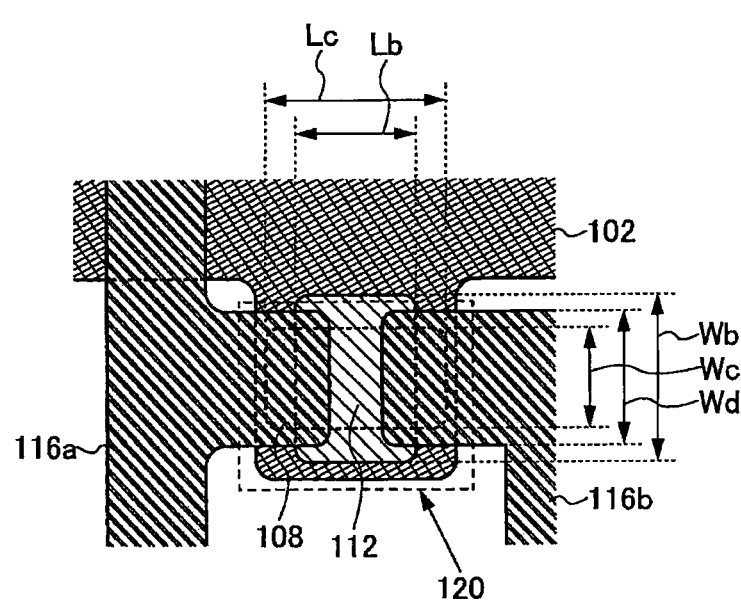

FIGS. 1A to 1C illustrate the transistor 120 in which the length of the semiconductor layer 108 (Lc) is made large so that the semiconductor layer 108 extends beyond edges of the gate electrode layer 102 in the channel length direction; however, the length of the semiconductor layer 108 (Lc) may be made small so that the whole region of the semiconductor layer 108 may be located over the gate electrode layer 102. Note that FIG. 2A is a top view and FIG. 2B is a cross-sectional view taken along line A1-B1 of FIG. 2A.

In FIGS. 1A to 1C and FIGS. 2A and 2B, the width of the carbide layer 112 (Wb) is made larger than the width of the semiconductor layer 108 (Wc). The widths of the source electrode layer 116a and the drain electrode layer 116b (Wd) may each be larger than the width of the semiconductor layer 108 (Wc) in regions where the source electrode layer 116a and the drain electrode layer 116b overlap the semiconductor layer 108 (see FIGS. 3A and 3B). With such a structure, regions of the semiconductor layer 108, with which the carbide layer 112 is not in contact, can be covered with the source electrode layer 116a and the drain electrode layer 116b. Accordingly, there is an advantage that the semiconductor layer 108 is protected and the reliability is improved. Further, contact resistance between the semiconductor layer 108 and the source and drain electrode layers 116a and 116b can be reduced by an increase in the contact area between the semiconductor layer 108 and the source and drain electrode layers 116a and 116b.

The widths of the source electrode layer 116a and the drain electrode layer 116b (Wd) indicate the lengths of the source electrode layer 116a and the drain electrode layer 116b in the channel width direction.

The widths of the source electrode layer 116a and the drain electrode layer 116b (Wd) may be larger than the width of the carbide layer 112 (Wb). Alternatively, only one of the widths of the source electrode layer 116a and the drain electrode layer 116b (Wd) may be larger than the width of the semiconductor layer 108 (Wc) (or the width of the carbide layer 112 (Wb)).

In the structures described in this embodiment, a light-blocking portion such as a black matrix may be provided above and/or below the carbide layer 112 to shield the carbide layer 112 from light. Variation in electrical characteristics of the transistor due to irradiation of the carbide layer 112 with light can be suppressed by a structure in which the carbide layer 112 is shield from light. In the case where the gate electrode layer 102 is formed using a light-blocking material, a light-blocking portion such as a black matrix may be provided over the carbide layer 112 (on the side opposite to the gate electrode layer 102).

Next, the effectiveness of the carbide layer provided in contact with the semiconductor layer is described on the basis of computation simulation. Note that the effect of silicon carbide (SiC) and amorphous silicon (a-Si) which block hydrogen was researched here.

<Calculation Method>

First, motion of atoms was tracked by numerically solving equations of motion for each atom by classical molecular dynamics simulation where the temperature T was set at 25° C. With the use of mean-square displacement of hydrogen atoms (H atoms) obtained from the calculation results, the diffusion coefficient D of H atoms was calculated from Einstein's relation (Formula 1). As the diffusion coefficient D is larger, diffusion is more likely to be caused.

[Formula 1]

$$\lim_{t \to \infty} \left\langle \frac{1}{N} \sum_{i=1}^{N} |r_i(t) - r_i(0)|^2 \right\rangle_t = 6Dt \quad \text{(Formula 1)}$$

$\left\langle \frac{1}{N} \sum_{i=1}^{N} |r_i(t) - r_i(0)|^2 \right\rangle_t$:

The mean-square displacement of $H$ atoms $N$: the number of $H$ atoms $r_i(t)$: position of the $i$-th $H$ arom in time "$t$"

$\langle \ \rangle_t$: time average

<Calculation Model and Calculation Conditions>

Figure 4A:
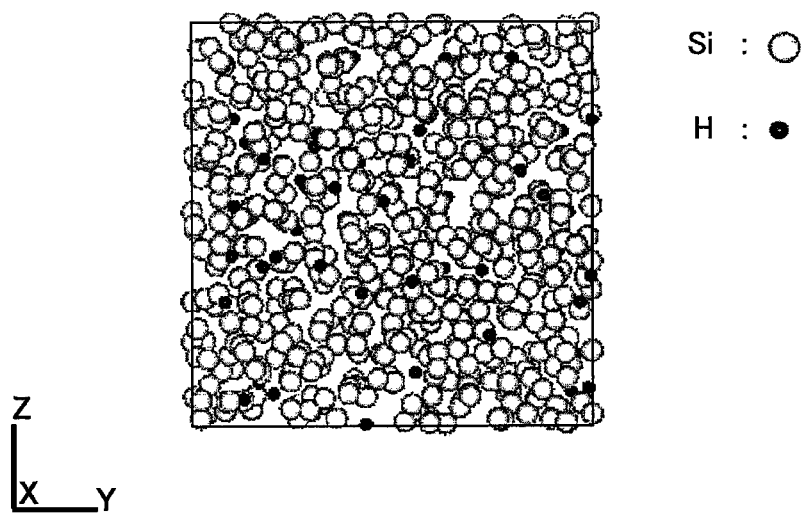
FIGS. 4A and 4B illustrate models which are used in simulation.
Figure 4B:
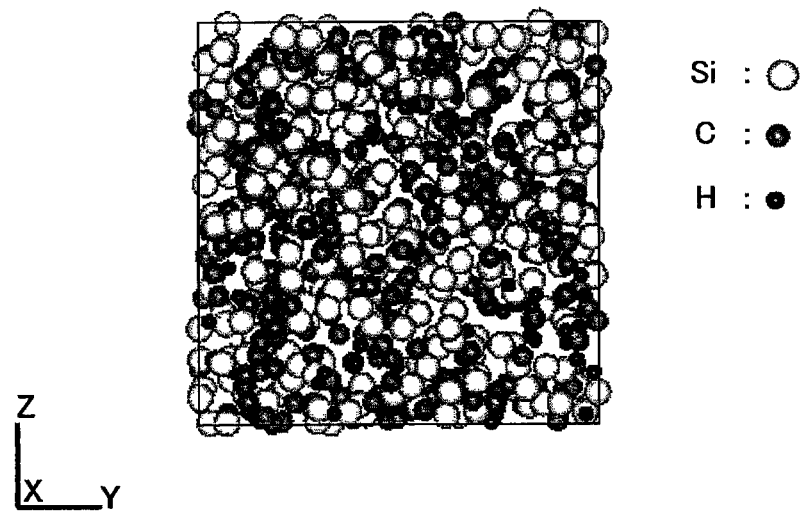

FIG. 4A illustrates an a-Si:H model (density: 2.30 g/cm$^3$) in which 60H atoms (10 atm %) are added into 540 a-Si atoms. FIG. 4B illustrates an a-SiC:H model (density: 3.22 g/cm$^3$) in which 67H atoms (10 at. %) are added into 600 a-SiC atoms. Here, three-dimensional periodic boundary conditions are used, which allows calculation of a bulk.

An empirical potential which characterizes the interaction between atoms is defined in the classical molecular dynamics method which is used in this calculation, so that force that acts on each atom is evaluated. For the a-Si:H model, a Tersoff potential (between silicon atoms) and a Lennard-Jones potential (between a silicon atom and a hydrogen atom, between hydrogen atoms) were used. For the a-SiC:H model, a Tersoff potential (between silicon atoms, between carbon atoms, between a silicon atom and a carbon atom) and a Lennard-Jones potential (between a silicon atom and a hydrogen atom, between a carbon atom and a hydrogen atom, between hydrogen atoms) were used. As a calculation program, simulation software "Materials Explorer 5.0", which is manufactured by Fujitsu Limited, was used.

Classical molecular dynamics simulation was performed on each calculation model under the conditions where the number of atoms was fixed, the volume was fixed, and the temperature T was set at 25° C. (time step: 0.2 fsec×5 million steps) to obtain the mean-square displacement of hydrogen.

<Calculation Results and Consideration>

Figures 5A, 5B:
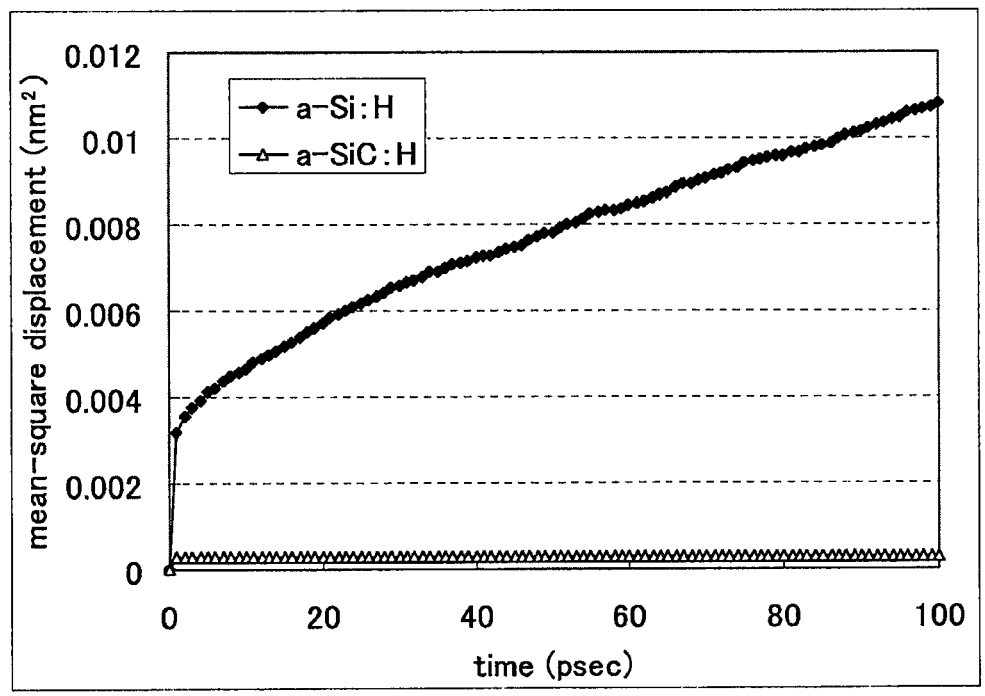
FIGS. 5A and 5B show calculation results of diffusion coefficients of hydrogen obtained by simulation.

The mean-square displacement of H atoms in a-Si and the mean-square displacement of H atoms in a-SiC, which were obtained from the calculation, are shown in FIG. 5A. FIG. 5B shows the diffusion coefficients D of H atoms in the calculation models, each of which are obtained from the region where the slope in the graph of FIG. 5A is substantially constant (60 psec to 100 psec). From FIG. 5B, it was found that H in a-SiC are less likely to be diffused than H atoms in a-Si. In other words, it seems that an a-SiC film has a high effect of preventing entry of hydrogen into the semiconductor layer as compared to an a-Si film.

Next, an example of a manufacturing method of the transistor illustrated in FIGS. 1A to 1C is described with reference to FIGS. 6A to 6D and FIGS. 7A and 7B.

First, the gate electrode layer 102 is formed over the substrate 100 and the gate insulating film 104 is formed over the gate electrode layer 102. Then, a semiconductor film 106 is formed over the gate insulating film 104 (see FIG. 6A).

A substrate having an insulating surface may be used as the substrate 100, and for example, a glass substrate can be used.

Alternatively, as the substrate 100, an insulating substrate formed using an insulator such as a ceramic substrate, a quartz substrate, or a sapphire substrate; a semiconductor substrate which is formed using a semiconductor material such as silicon and whose surface is covered with an insulating material; or a conductive substrate which is formed using a conductor such as metal or stainless steel and whose surface is covered with an insulating material can be used. Further alternatively, a plastic substrate can be used as long as it can withstand heat treatment in a manufacturing process.

The gate electrode layer 102 can be formed in the following manner: after a conductive film is formed over an entire surface of the substrate 100, the conductive film is etched by a photolithography method.

The gate electrode layer 102 can be formed using a conductive material such as aluminum (Al), copper (Cu), molybdenum (Mo), tungsten (W), or titanium (Ti). Note that when aluminum is used alone for the wiring or the electrode, there are problems in that aluminum has low heat resistance and that aluminum is easily eroded, for example. Therefore, it is preferable to use aluminum in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc); an alloy containing the above element as its component; an alloy film containing a combination of the above elements; or a nitride containing the above element as its component may be used. A film formed using any of these heat-resistant conductive materials and an aluminum (or copper) film may be stacked, so that the wiring and the electrode may be formed.

The gate electrode layer 102 may be formed using a material having high conductivity and a light-transmitting property. As such a material, indium tin oxide (ITO), indium tin oxide containing silicon oxide (ITSO), organoindium, organotin, zinc oxide (ZnO), or the like can be used, for example. The gate electrode layer 102 can be formed to have a single layer structure or a stacked structure of two or more layers using any of the above-mentioned materials.

Note that an insulating film serving as a base film may be provided between the substrate 100 and the gate electrode layer 102. The base film has a function of preventing diffusion of an impurity element from the substrate 100, and can be formed to have a single layer or stacked structure using one or more films selected from a silicon nitride film, a silicon oxide film, a silicon nitride oxide film, and a silicon oxynitride film.

The gate insulating film 104 can be formed using a silicon oxide film, a silicon oxynitride film, a silicon nitride film, a silicon nitride oxide film, an aluminum oxide film, a tantalum oxide film, or the like. Further, any of these films may be stacked. For example, any of these films can be formed by a sputtering method or the like with a thickness of greater than or equal to 10 nm and less than or equal to 500 nm.

The semiconductor film 106 can be formed using any of the following materials: a semiconductor material formed of a Group 14 element such as silicon, germanium, or silicon germanium; a compound semiconductor material such as GaAs, InP, or GaN; and an oxide semiconductor material including zinc oxide, tin oxide, or the like. The crystallinity of the semiconductor film 106 may be either single crystal or non-single-crystal (e.g., polycrystalline, microcrystalline, or amorphous). Note that the semiconductor film 106 may include two or more crystal structures among the above crystal structures (e.g., the amorphous structure and the microcrystalline structure (or the polycrystalline structure)).

As the oxide semiconductor material, an In—Ga—Zn—O-based non-single-crystal film or any of the following oxide semiconductor materials can be used: an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O based oxide semiconductor, an Sn—Zn—O-based oxide semiconductor, an Al—Zn—O-based oxide semiconductor, an In—O-based oxide semiconductor, an Sn—O-based oxide semiconductor, a Zn—O-based oxide semiconductor, and an In—Sn—O-based oxide semiconductor. For example, an oxide semiconductor film is formed by a sputtering method using an In—Ga—Zn—O-based oxide semiconductor target. Alternatively, the oxide semiconductor film can be formed by a sputtering method under a rare gas (typically argon) atmosphere, an oxygen atmosphere, or an atmosphere including a rare gas (typically argon) and oxygen. In the case of using a sputtering method, the film formation may be performed with a target including SiO at greater than or equal to 2 wt % and less than or equal to 10 wt % so that $SiO_x$ (X>0) which inhibits crystallization may be included in the oxide semiconductor film. Thus, crystallization can be suppressed at the time of heat treatment for dehydration or dehydrogenation to be performed in a later process.

Figure 6A:
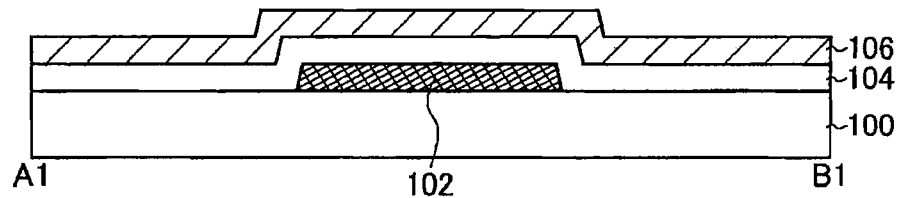
FIGS. 6A to 6D illustrate an example of a manufacturing method of a transistor according to Embodiment 1.
Figure 6B:
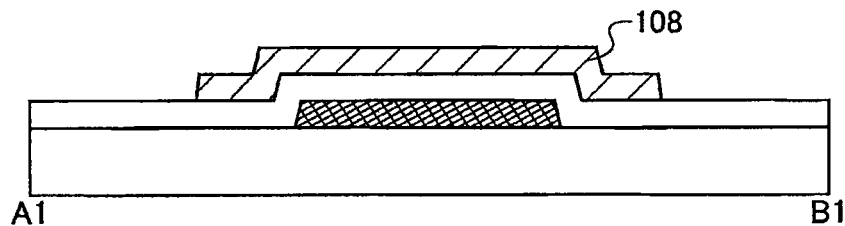

Next, the semiconductor film 106 is etched to form the island-shaped semiconductor layer 108 (see FIG. 6B). At this time, the semiconductor film 106 is etched so that the island-shaped semiconductor layer 108 remains at least above the gate electrode layer 102.

Figure 6C:
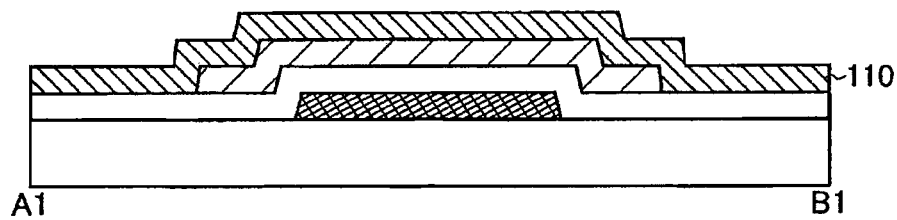

Then, a carbide film 110 is formed so as to cover the semiconductor layer 108 (see FIG. 6C).

The carbide film 110 can be formed by a sputtering method. In this case, the carbide film 110 can be formed by a DC or RF sputtering method using a silicon carbide target or a silicon carbide target to which boron is added, under an argon atmosphere at greater than or equal to a room temperature and less than or equal to 400° C., preferably at greater than or equal to a room temperature and less than or equal to 100° C. However, without limitation to this, the carbide film 110 may be formed by a CVD method or the like at greater than or equal to 100° C. and less than or equal to the upper temperature limit of the substrate. The thickness of the carbide film 110 can be set to greater than or equal to 1 nm and less than or equal to 500 nm, preferably greater than or equal to 10 nm and less than or equal to 100 nm.

For example, the carbide film 110 is formed by a sputtering method in an atmosphere which does not include hydrogen such as an argon atmosphere or an atmosphere which includes a small amount of hydrogen, whereby the concentration of hydrogen contained in the carbide film 110 can be reduced. Accordingly, change in semiconductor characteristics of the semiconductor layer 108 due to hydrogen contained in the carbide film 110 can be reduced.

In the case of using an oxide semiconductor film or an amorphous silicon film as the semiconductor film 106, the semiconductor film 106 and the carbide film 110 can be formed successively by a sputtering method. When the semiconductor film 106 and the carbide film 110 are successively formed, the semiconductor film 106 is not exposed to the atmosphere; thus, entry of impurities between the semiconductor film 106 and the carbide film 110 can be suppressed.

Figure 6D:
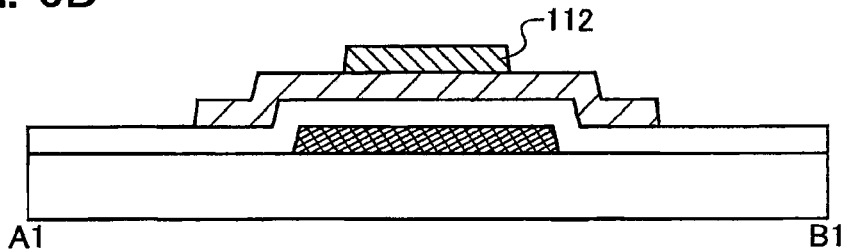

Next, the carbide film 110 is etched to form the island-shaped carbide layer 112 (see FIG. 6D). At this time, the carbide film 110 is etched so that the island-shaped carbide layer 112 remains at least in a region that overlaps the gate electrode layer 102. In addition, the carbide film 110 is etched so as to expose at least part of the semiconductor layer 108.

As the etching, dry etching with the use of a fluorine-based gas such as $CF_4$, $SF_6$, or $NF_3$ can be applied. In the case of using an oxide semiconductor material for the semiconductor layer 108, etching selectivity of the carbide layer 112 with respect to the semiconductor layer 108 can be high and the carbide layer 112 can be favorably etched while the semiconductor layer 108 is hardly etched. Further, damage to the semiconductor layer 108 can be reduced.

Note that etching selectivity shows, for example in the case of etching a layer A and a layer B, the difference between etching rates of the layer A and the layer B. Accordingly, a high etching selectivity means that there is a sufficient difference between the etching rates.

At this time, heat treatment may be performed in the case of using an oxide semiconductor material for the semiconductor layer 108. The heat treatment eliminates substances including hydrogen atoms in the oxide semiconductor layer; thus, a structure of the oxide semiconductor layer can be improved and defect level in energy gap can be reduced. The heat treatment is performed under an inert gas atmosphere at greater than or equal to 250° C. and less than or equal to 700° C., preferably greater than or equal to 450° C. and less than or equal to 600° C. or less than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a way that, for example, an object to be heated is introduced into an electric furnace in which a resistance heating element or the like is used and heated, under a nitrogen atmosphere at 450° C. for an hour. During the heat treatment, the oxide semiconductor layer is not exposed to the atmosphere to prevent the entry of water and hydrogen.

The impurities are reduced by the heat treatment, leading to an i-type semiconductor layer (an intrinsic semiconductor layer) or a substantially i-type semiconductor layer. Accordingly, a transistor having extremely excellent characteristics can be realized.

The above heat treatment has an effect of removing hydrogen, water, and the like and can be referred to as dehydration treatment, dehydrogenation treatment, or the like. The heat treatment can be performed at any timing, for example, during the formation of the oxide semiconductor layer, or after the semiconductor layer is processed to have an island shape. Such dehydration treatment or dehydrogenation treatment may be conducted not only once but also plural times.

Figure 7A:
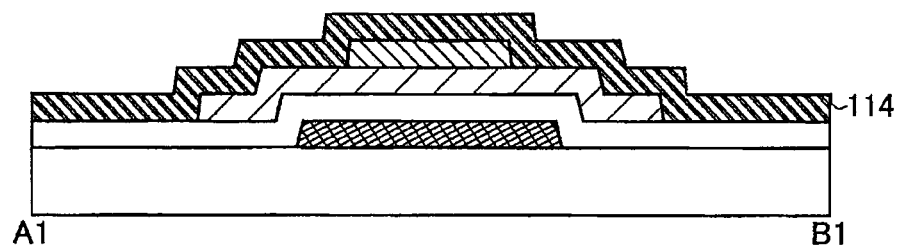
FIGS. 7A and 7B illustrate an example of a manufacturing method of a transistor according to Embodiment 1.

Then, a conductive film 114 is formed over the gate insulating film 104, the semiconductor layer 108, and the carbide layer 112 (see FIG. 7A).

The conductive film 114 can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as a component; or a material including a nitride or the like in which the above element is included.

The conductive film 114 may be formed using a material having high conductivity and a light-transmitting property. As such a material, indium tin oxide (ITO), indium tin oxide containing silicon oxide (ITSO), organoindium, organotin, zinc oxide (ZnO), or the like can be used, for example.

For example, the conductive film 114 can be formed to have a single layer structure of a molybdenum film or a titanium film. The conductive film 114 may be formed to have a stacked structure and, for example, can be formed to have a stacked structure of an aluminum film and a titanium film. Alternatively, a three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these stacked structures, an aluminum film including neodymium (an Al—Nd film) may be used. Further alternatively, the conductive film 114 may be formed to have a single layer structure of an aluminum film including silicon. Moreover, the conductive film 114 may be formed to have a stacked structure of an aluminum film and an ITO film. The thickness of the conductive film 114 is set to 1 nm to 200 nm.

Figure 7B:
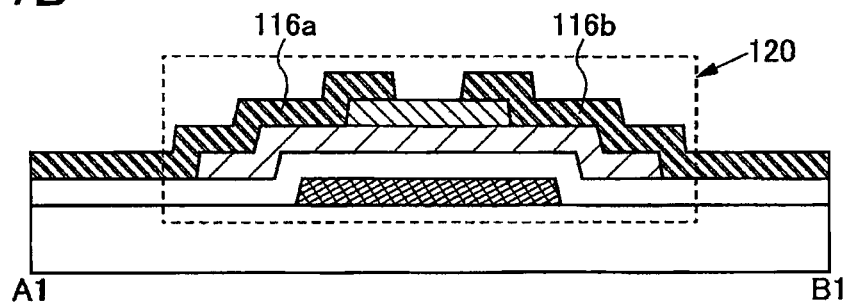

Next, the conductive film 114 is etched to form the source electrode layer 116a and the drain electrode layer 116b (see FIG. 7B).

In the above-described step, the carbide layer 112 serves as a channel protective layer (a channel stop layer) which suppresses etching of the semiconductor layer 108 when the conductive film 114 is etched.

As illustrated in FIG. 7B, the carbide layer 112 is provided in contact with the back channel side (the surface on the side opposite to the gate electrode layer 102) of the semiconductor layer 108, whereby the carbide layer 112 serves as a channel protective layer and entry of an element or the like which causes change in semiconductor characteristics into the semiconductor layer 108 can be suppressed. As a result, change in semiconductor characteristics of the semiconductor layer 108 due to the entry of an element or the like which causes change in semiconductor characteristics can be suppressed; accordingly, variation in electrical characteristics and deterioration of a transistor in which the semiconductor layer 108 is used as a channel layer can be suppressed. Deterioration, change in qualities of the carbide layer can be suppressed when the carbide layer is exposed to various chemical solutions in the manufacturing process because the carbide layer is a chemically stable film. The carbide layer is also a thermally stable film, and thus, change in the state can be suppressed when the interface between the semiconductor layer and the carbide layer is heated. As compared to the case where the carbide layer 112 is not provided in contact with the semiconductor layer 108, change in semiconductor characteristics caused by exposure of the semiconductor layer 108 can be suppressed.

Through the above process, the transistor 120 can be manufactured.

Further, a protective insulating layer may be formed so as to cover the transistor 120. As the protective insulating layer, for example, a single layer or a stacked layer of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a CVD method, a sputtering method, or the like. Further, after the source electrode layer 116a and the drain electrode layer 116b are formed, the exposed portion of the carbide layer 112 may be oxidized (including natural oxidation) or nitrided to form a silicon oxide film, a silicon nitride film, a silicon oxynitride film, or a silicon nitride oxide film in a region over the carbide layer 112, which is located between the source electrode layer 116a and the drain electrode layer 116b.

Then, various electrodes and wirings are formed, whereby a semiconductor device including the transistor 120 is completed.

The case where the carbide layer 112 is formed after the semiconductor layer 108 is formed is illustrated in FIGS. 6A to 6D and FIGS. 7A and 7B. However, after the semiconductor film 106 and the carbide film 110 are formed in succession so as to be stacked, they may be patterned into the semiconductor layer 108 and the carbide layer 112, respectively, with a plurality of masks. By forming the semiconductor film 106 and the carbide film 110 in succession in this manner, damage to the surface of the semiconductor film 106 due to plasma or the like can be reduced.

Figure 8:
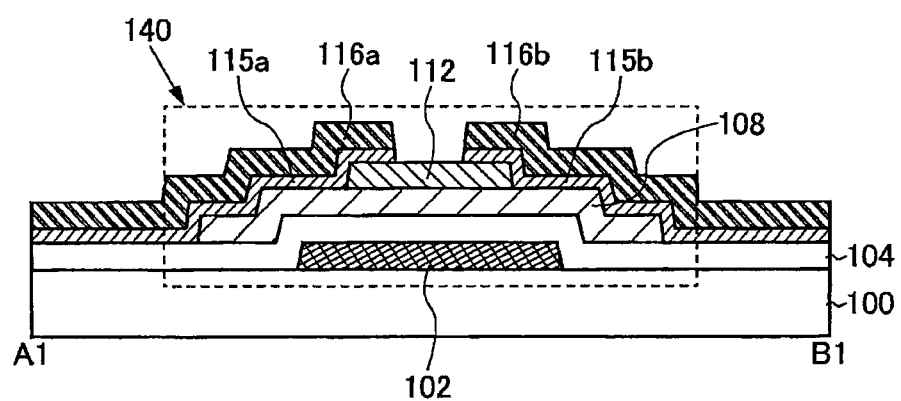
FIG. 8 illustrates a structure of a transistor according to Embodiment 1.

Further, in the structure illustrated in FIGS. 1A to 1C, a low resistance layer 115a can be provided between the semiconductor layer 108 and the source electrode layer 116a and a low resistance layer 115b can be provided between the semiconductor layer 108 and the drain electrode layer 116b (see FIG. 8). The low resistance layers 115a and 115b have resistance which is lower than resistance of the semiconductor layer 108. The low resistance layers 115a and 115b are provided, so that contact resistance between the source electrode layer 116a and the semiconductor layer 108 and contact resistance between the drain electrode layer 116b and the semiconductor layer 108 can be reduced. In FIG. 8, after the formation of the carbide layer 112, a low resistance film and a conductive film are formed over the entire surface of the substrate, and then the low resistance layers 115a and 115b, the source electrode layer 116a, and the drain electrode layer 116b are formed.

In the case of using silicon for the semiconductor layer 108, a material in which an impurity element imparting one conductivity type is added to silicon may be used for the low resistance layers 115a and 115b. For example, an n-type silicon film such as an amorphous silicon film including an impurity element imparting n-type conductivity such as phosphorus (P), or the like to can be used. In the case of using an oxide semiconductor for the semiconductor layer 108, oxide conductive layers can be used as the low resistance layers 115a and 115b. As a material of the oxide conductive layer, a conductive material that transmits visible light, for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, a Zn—O-based metal oxide, or In—Sn—O-based metal oxide can be employed. The thickness of the oxide conductive layer is selected as appropriate, in the range of greater than or equal to 1 nm and less than or equal to 300 nm. In the case of using a sputtering method, the film formation may be performed with a target including $SiO_2$ at greater than or equal to 2 wt % and less than or equal to 10 wt % so that $SiO_x$ (X>0) which inhibits crystallization may be included in the conductive film which transmits light. Thus, crystallization can be suppressed at the time of heat treatment for dehydration or dehydrogenation to be performed in a later process.

This embodiment can be implemented in appropriate combination with any of the structures described in the other embodiments.

Embodiment 2

In this embodiment, structures of a semiconductor device which are different from those described in Embodiment 1 and a manufacturing method thereof are described with reference to FIGS. 9A to 9C and FIGS. 10A to 10D. The structure and the manufacturing method (e.g., applicable materials) described in this embodiment are in common with those of Embodiment 1 in many points. Thus, description of the common points is omitted and only points different from those of Embodiment 1 are described in detail below.

Figure 9A:
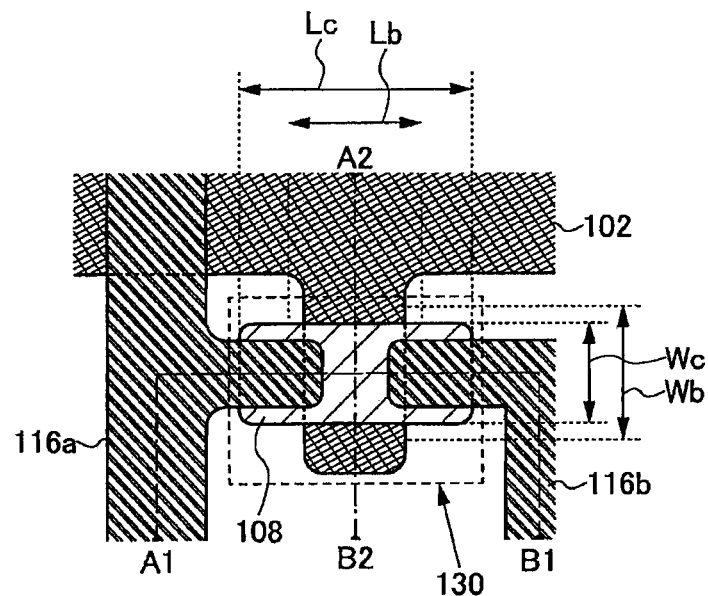
FIGS. 9A to 9C illustrate structures of a transistor according to Embodiment 2.
Figure 9B:
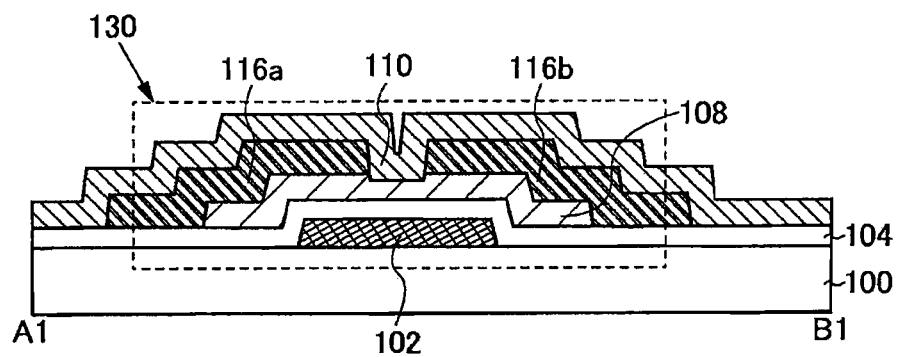

FIG. 9A is a top view and FIG. 9B is a cross-sectional view taken along line A1-B1 of FIG. 9A.

First, structures of the transistor of this embodiment are described. A transistor 130 illustrated in FIGS. 9A and 9B includes the gate electrode layer 102 provided over the substrate 100, the gate insulating film 104 provided over the gate electrode layer 102, the semiconductor layer 108 provided over the gate insulating film 104, the source electrode layer 116a and the drain electrode layer 116b which are electrically connected to the semiconductor layer 108, and the carbide film 110 provided so as to cover the semiconductor layer 108, the source electrode layer 116a, and the drain electrode layer 116b (see FIGS. 9A and 9B). In the transistor 130, part of the semiconductor layer 108, which is located between the source and the drain, is removed. Such a transistor is also referred to as a channel-etched transistor.

The carbide film is provided so as to cover the semiconductor layer 108, the source electrode layer 116a, and the drain electrode layer 116b of the transistor 130. The carbide film is provided in contact with the back-channel side of the semiconductor layer, whereby the carbide film serves as a protection film, which can prevent moisture or the like from being in contact with or entering the semiconductor layer. As a result, change in semiconductor characteristics of the semiconductor layer 108 due to entry or contact of an impurity such as hydrogen can be suppressed; accordingly, variation and deterioration in electrical characteristics of the transistor in which the semiconductor layer 108 is used as a channel layer can be suppressed.

Figure 9C:
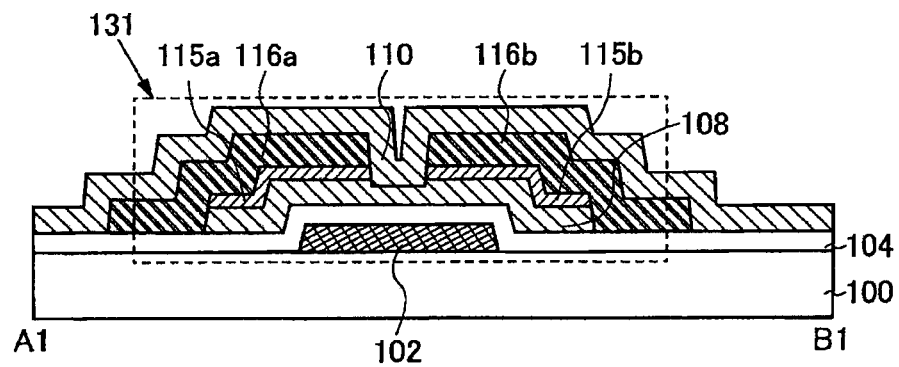

In the structure illustrated in FIGS. 9A to 9C, a silicon carbide film can be used as the carbide film 110 which is provided over and in contact with the surface of the semiconductor layer 108. Silicon nitride carbide, germanium carbide, or the like may be used other than a silicon carbide. Alternatively, an impurity imparting one conductivity type may be added to the silicon carbide. For example, n-type silicon carbide including an impurity element imparting n-type conductivity such as phosphorus or arsenic, or p-type silicon carbide including an impurity element imparting p-type conductivity such as boron, aluminum, or gallium. The carbide film 110 can be formed using one or combination of the above-mentioned materials.

Further, the transistor 130 may have a structure in which the low resistance layer 115a is provided between the semiconductor layer 108 and the source electrode layer 116a and a low resistance layer 115b is provided between the semiconductor layer 108 and the drain electrode layer 116b (see the transistor 131 illustrated in FIG. 9C). The low resistance layers 115a and 115b have resistance which is lower than resistance of the semiconductor layer 108. The low resistance layers 115a and 115b are provided, so that contact resistance between the source electrode layer 116a and the semiconductor layer 108 and contact resistance between the drain electrode layer 116b and the semiconductor layer 108 can be reduced.

In the case of using silicon for the semiconductor layer 108, a material in which an impurity element imparting one conductivity type is added to silicon may be used for the low resistance layers 115a and 115b. For example, an n-type silicon film such as an amorphous silicon film including an impurity element imparting n-type conductivity such as phosphorus (P), or the like to can be used. In the case of using an oxide semiconductor for the semiconductor layer 108, oxide conductive layers can be used as the low resistance layers 115a and 115b. As a material of the oxide conductive layer, a conductive material that transmits visible light, for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, a Zn—O-based metal oxide, or In—Sn—O-based metal oxide can be employed. The thickness of the oxide conductive layer is selected as appropriate, in the range of greater than or equal to 1 nm and less than or equal to 300 nm. In the case of using a sputtering method, the film formation may be performed with a target including $SiO_2$ at greater than or equal to 2 wt % and less than or equal to 10 wt % so that $SiO_x$ (X>0) which inhibits crystallization may be included in the conductive film which transmits light. Thus, crystallization can be suppressed at the time of heat treatment for dehydration or dehydrogenation to be performed in a later process.

Next, an example of a manufacturing method of the transistor illustrated in FIGS. 9A to 9C is described with reference to FIGS. 10A to 10D.

First, the gate electrode layer 102 is formed over the substrate 100, and then the gate insulating film 104 is formed over the gate electrode layer 102. The semiconductor layer 108 is formed over the gate insulating film 104 (see FIG. 10A).

Figure 10A:
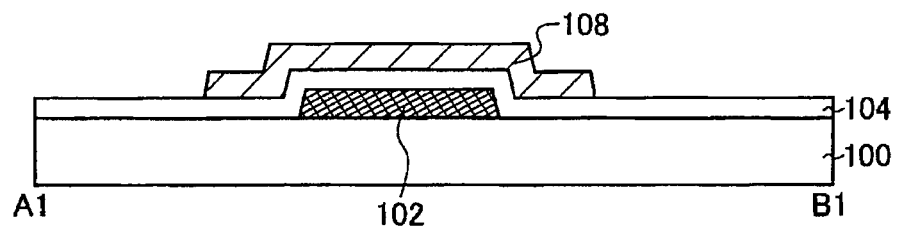
FIGS. 10A to 10D illustrate an example of a manufacturing method of a transistor according to Embodiment 2.
Figure 10B:
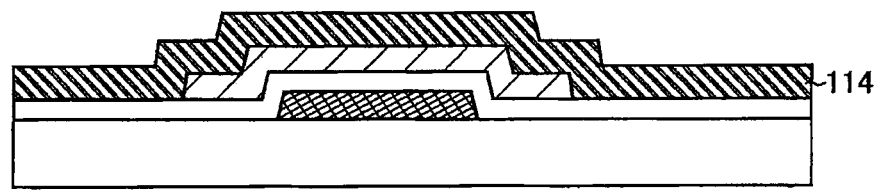

Next, the conductive film 114 is formed over the gate insulating film 104 and the semiconductor layer 108 (see FIG. 10B).

Figure 10C:
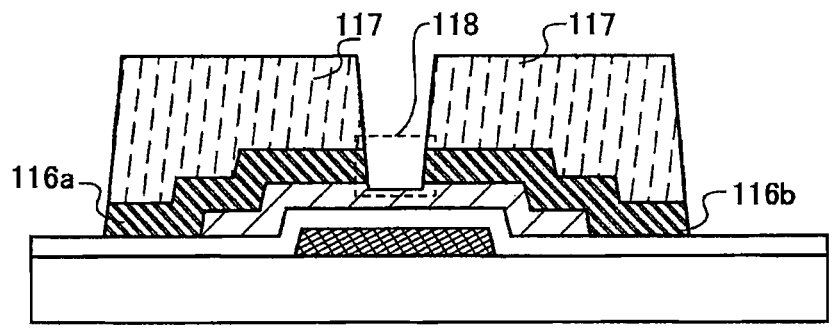

Then, a resist mask 117 is formed and the conductive film 114 is selectively etched to form the source electrode layer 116a and the drain electrode layer 116b, while part (part near the surface) of the island-shaped semiconductor layer 108 is removed (channel-etched) to form a recessed portion in the island-shaped semiconductor layer 108. As illustrated in FIG. 10C, part of the semiconductor layer 108 is removed to form a recessed portion 118, whereby the source electrode layer 116a and the drain electrode layer 116b are electrically insulated from each other without fault. Note that the resist mask 117 is removed after the etching.

Figure 10D:
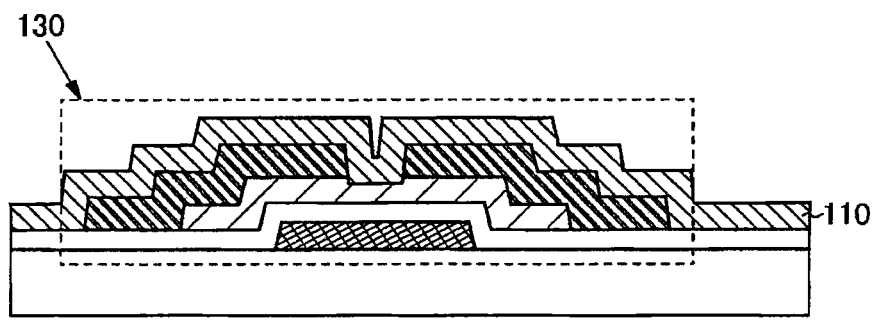

Then, the carbide film 110 is formed so as to cover the semiconductor layer and the conductive layers (see FIG. 10D).

Through the above-described process, the transistor 130 can be manufactured.

Note that in FIGS. 10A to 10D, the case where the carbide film 110 is formed so as to cover the transistor 130 is described; however, one embodiment of the present invention is not limited thereto. The carbide film 110 may be provided in contact with at least a region in which a channel is formed in the semiconductor layer 108.

In the case of using an oxide semiconductor for the semiconductor layer 108, dehydration treatment or dehydrogenation treatment is preferably performed. The dehydration treatment or dehydrogenation treatment can be performed at any timing, for example, during the formation of the oxide semiconductor layer, or after the oxide semiconductor layer is processed to have an island shape. Such dehydration treatment or dehydrogenation treatment may be conducted not only once but also plural times.

This embodiment can be implemented in appropriate combination with any of the structures described in the other embodiments.

Embodiment 3

In this embodiment, structures of a semiconductor device which are different from those described in Embodiment 1 and a manufacturing method thereof are described with reference to FIGS. 11A to 11C and FIGS. 12A to 12E. The structure and the manufacturing method (e.g., applicable materials) described in this embodiment are in common with those of Embodiment 1 in many points. Thus, description of the common points is omitted and only points different from those of Embodiment 1 are described in detail below.

Figure 11A:
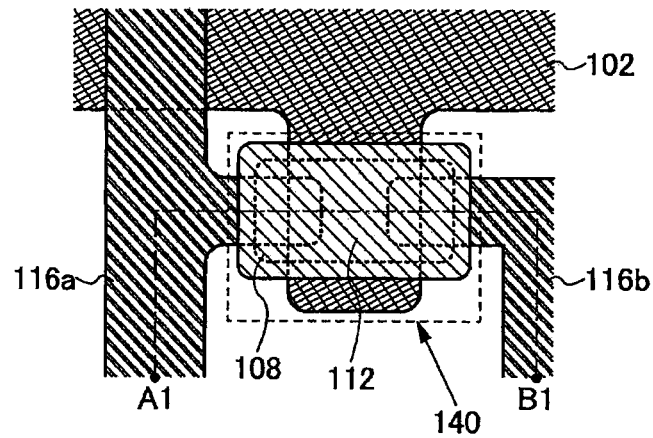
FIGS. 11A to 11C illustrate structures of a transistor according to Embodiment 3.
Figure 11B:
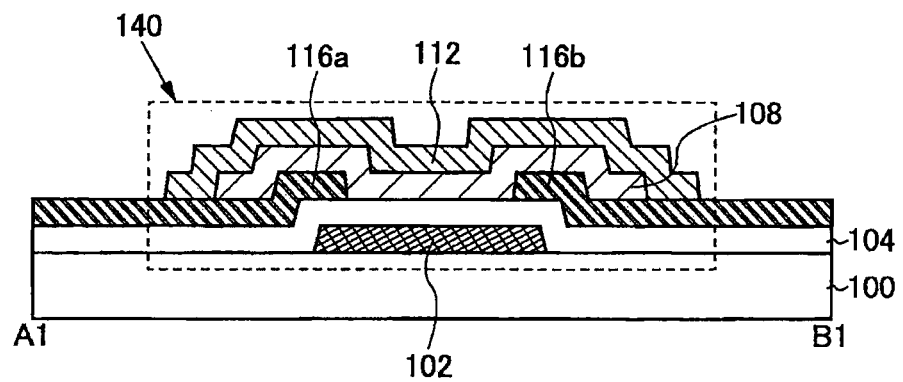

Note that FIG. 11A is a top view and FIG. 11B is a cross-sectional view taken along line A1-B1 of FIG. 11A.

A transistor 140 illustrated in FIGS. 11A and 11B includes the gate electrode layer 102 provided over the substrate 100, the gate insulating film 104 provided over the gate electrode layer 102, the source electrode layer 116a and the drain electrode layer 116b provided over the gate insulating film 104, the semiconductor layer 108 provided over the source electrode layer 116a and the drain electrode layer 116b and over the gate insulating film 104 which is located in a region above the gate electrode layer 102 and between the source electrode layer 116a and the drain electrode layer 116b, and the carbide layer 112 provided so as to cover the semiconductor layer 108 (see FIGS. 11A and 11B).

Figure 11C:
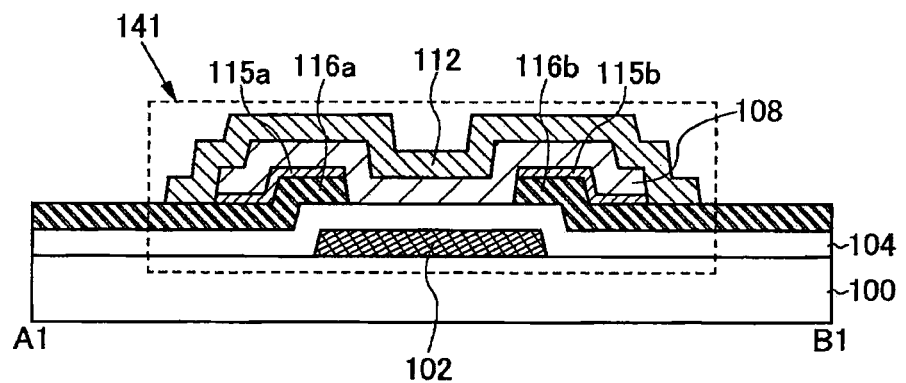

That is, the transistor 140 described in this embodiment have a structure where the position of the source electrode layer 116a and the drain electrode layer 116b and the position of the semiconductor layer 108 (the order of stacking) are interchanged in the structures of the above embodiments. The structures illustrated in FIGS. 11A to 11C are also referred to as a bottom-gate bottom-contact type. Note that FIG. 11A is a top view and FIG. 11B is a cross-sectional view taken along line A1-B1 of FIG. 11A.

As illustrated in FIGS. 11A and 11B, the carbide layer 112 is provided in contact with the back channel side (the surface on the side opposite to the gate electrode layer 102) of the semiconductor layer 108, whereby entry of an element or the like which causes change in semiconductor characteristics into the semiconductor layer 108 can be suppressed. As a result, change in semiconductor characteristics of the semiconductor layer 108 due to the entry of an element or the like which causes change in semiconductor characteristics can be suppressed; accordingly, change in electrical characteristics of a transistor in which the semiconductor layer 108 is used as a channel layer can be suppressed.

In the structure illustrated in FIGS. 11A to 11C, a silicon carbide layer can be used as the carbide layer 112 which is provided over and in contact with the surface of the semiconductor layer 108. Silicon nitride carbide, germanium carbide, or the like may be used other than silicon carbide. Alternatively, an impurity imparting one conductivity type may be added to the silicon carbide. For example, n-type silicon carbide including an impurity element imparting n-type conductivity such as phosphorus or arsenic, or p-type silicon carbide including an impurity element imparting p-type conductivity such as boron, aluminum, or gallium can be used. The carbide layer 112 can be formed using one or combination of the above-mentioned materials.

As in a transistor 141 illustrated in FIG. 11C, the low resistance layer 115a may be provided between the semiconductor layer 108 and the source electrode layer 116a and the low resistance layer 115b may be provided between the semiconductor layer 108 and the drain electrode layer 116b. The low resistance layers 115a and 115b are provided, so that contact resistance between the source electrode layer 116a and the semiconductor layer 108 and contact resistance between the drain electrode layer 116b and the semiconductor layer 108 can be reduced.

Next, an example of a manufacturing method of the transistor 140 illustrated in FIGS. 11A and 11B is described with reference to FIGS. 12A to 12E.

First, the gate electrode layer 102 is formed over the substrate 100 and the gate insulating film 104 is formed over the gate electrode layer 102. After that, the source electrode layer 116a and the drain electrode layer 116b are formed over the gate insulating film 104 (see FIG. 12A).

Figure 12A:
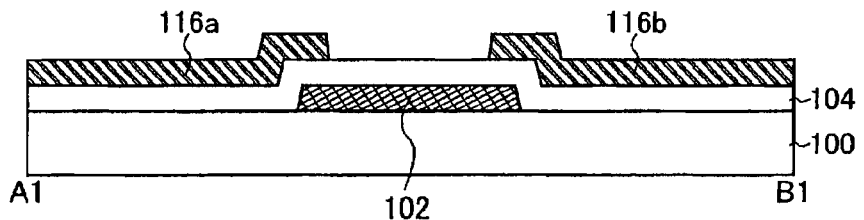
FIGS. 12A to 12E illustrate an example of a manufacturing method of a transistor according to Embodiment 3.
Figure 12B:
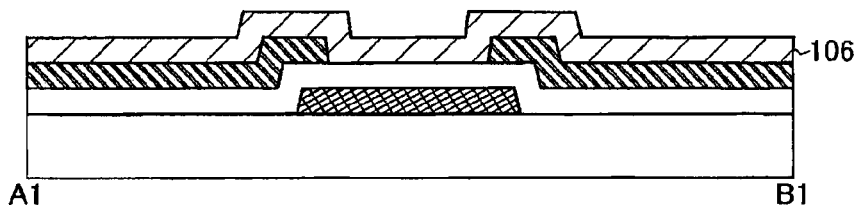

Next, the semiconductor film 106 is formed so as to cover the source electrode layer 116a and the drain electrode layer 116b (see FIG. 12B).

Figure 12C:
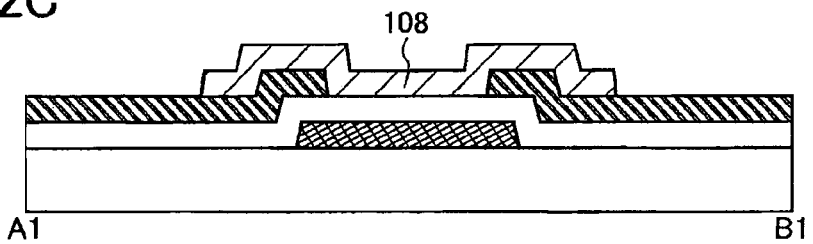

Then, the semiconductor film 106 is etched to form the island-shaped semiconductor layer 108 (see FIG. 12C). At this time, the semiconductor film 106 is etched so that the island-shaped semiconductor layer 108 remains at least above the gate electrode layer 102.

Figure 12D:
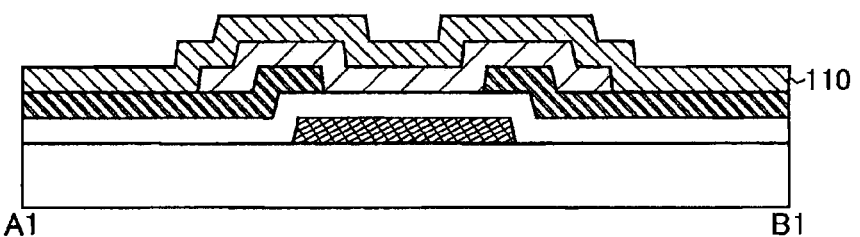

Next, the carbide film 110 is formed so as to cover the semiconductor layer 108 (see FIG. 12D).

Figure 12E:
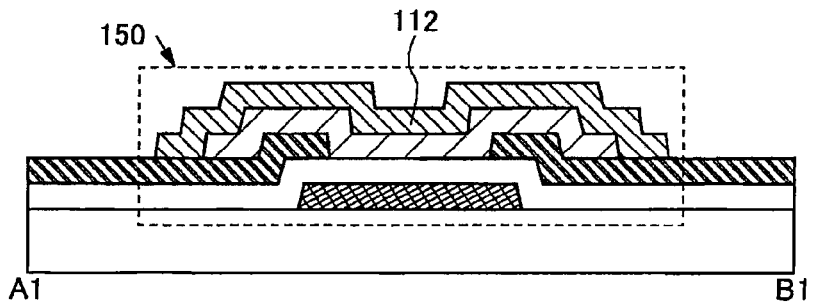

Then, the carbide film 110 is etched to form the island-shaped carbide layer 112 (see FIG. 12E).

Through the above process, the transistor 140 can be manufactured.

Note that a protective insulating layer may be formed so as to cover the transistor 140 after the transistor 140 is formed.

In the case where the transistor illustrated in FIG. 11C is manufactured, in FIG. 12A, a conductive film forming the source electrode layer 116a and the drain electrode layer 116b and a low resistance film are stacked in this order over the gate insulating film 104, and then the low resistance film is etched; thus, the low resistance layers 115a and 115b can be formed.

In the case of using silicon for the semiconductor layer 108, a material in which an impurity element imparting one conductivity type is added to silicon may be used for the low resistance layers 115a and 115b. For example, an n-type silicon film such as an amorphous silicon film including an impurity element imparting n-type conductivity such as phosphorus (P), or the like to can be used. In the case of using an oxide semiconductor for the semiconductor layer 108, oxide conductive layers can be used as the low resistance layers 115a and 115b. As a material of the oxide conductive layer, a conductive material that transmits visible light, for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, a Zn—O-based metal oxide, or In—Sn—O-based metal oxide can be employed. The thickness of the oxide conductive layer is selected as appropriate, in the range of greater than or equal to 1 nm and less than or equal to 300 nm. In the case of using a sputtering method, the film formation may be performed with a target including $SiO_2$ at greater than or equal to 2 wt % and less than or equal to 10 wt % so that $SiO_x$ (X>0) which inhibits crystallization may be included in the conductive film which transmits light. Thus, crystallization can be suppressed at the time of heat treatment for dehydration or dehydrogenation to be performed in a later process.

Figure 13A:
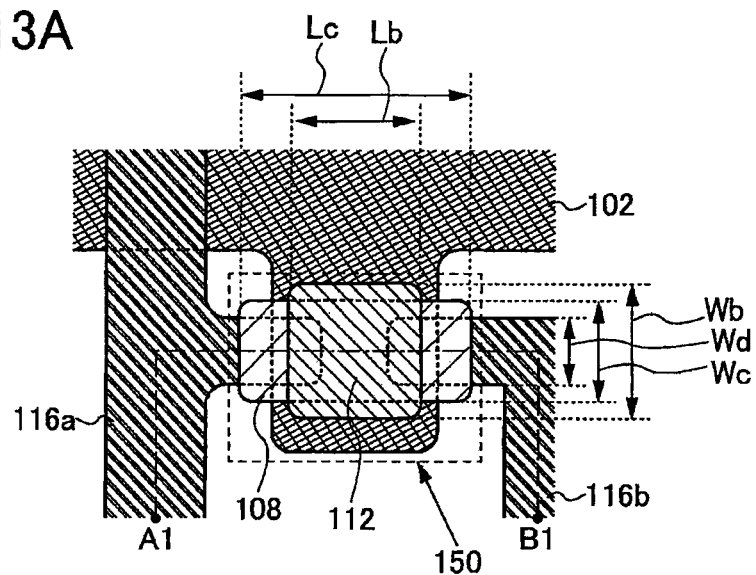
FIGS. 13A and 13B illustrate a structure of a transistor according to Embodiment 3.
Figure 13B:
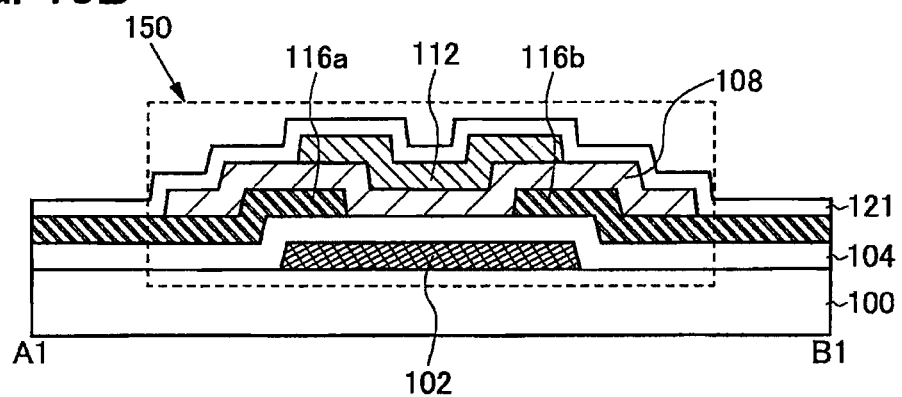

Note that in FIGS. 11A to 11C, the case where the island-shaped carbide layer 112 is formed so as to completely cover the semiconductor layer 108 is described; however, one embodiment of the present invention is not limited thereto. The carbide layer 112 may be provided so as to be in contact with at least a region where a channel is formed in the semiconductor layer 108. For example, the carbide layer 112 can be provided so as to be in contact with part of the semiconductor layer 108. For example, as in the transistor 150 illustrated in FIGS. 13A and 13B, the length of the carbide layer 112 (Lb) is set smaller than the length of the semiconductor layer 108 (Lc). Further, two regions which are not covered with the carbide layer 112 are provided in the channel length direction, and the source electrode layer 116a and the drain electrode layer 116b are provided in the two regions that are apart from each other so as to be electrically connected. When such a structure is employed, the carbide layer 112 may be formed so as to be in contact with part of the semiconductor layer 108 (formed so as not to be in contact with the source electrode layer 116a and the drain electrode layer 116b), and a protective insulating layer 121 may be provided over the carbide layer 112, the semiconductor layer 108, and the source electrode layer 116a and the drain electrode layer 116b. In this manner, leakage current caused by change in semiconductor characteristics of the surface of the semiconductor layer 108 can be reduced.

As the protective insulating layer 121, for example, a single layer or a stacked layer of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a CVD method, a sputtering method, or the like.

In the case of using oxide semiconductor for the semiconductor layer 108, dehydration treatment or dehydrogenation treatment is preferably performed. The dehydration treatment or dehydrogenation treatment can be performed at timing, for example, during the formation of the semiconductor layer, or after the semiconductor layer is processed to have an island shape. Such dehydration treatment or dehydrogenation treatment may be conducted not only once but also plural times.

This embodiment can be implemented in appropriate combination with any of the structures described in the other embodiments.

Embodiment 4

Figures 1, 14A:
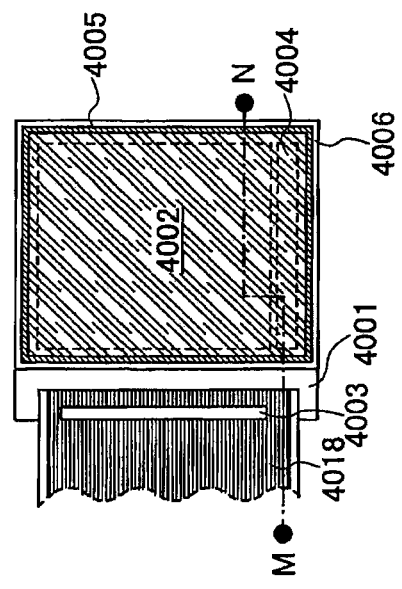
FIGS. 14A-1, 14A-2, and 14B illustrate examples of a semiconductor device according to Embodiment 4.
Figures 2, 14A:
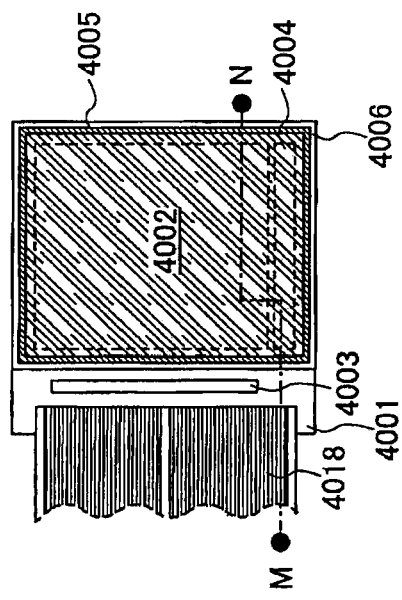
Figure 14B:
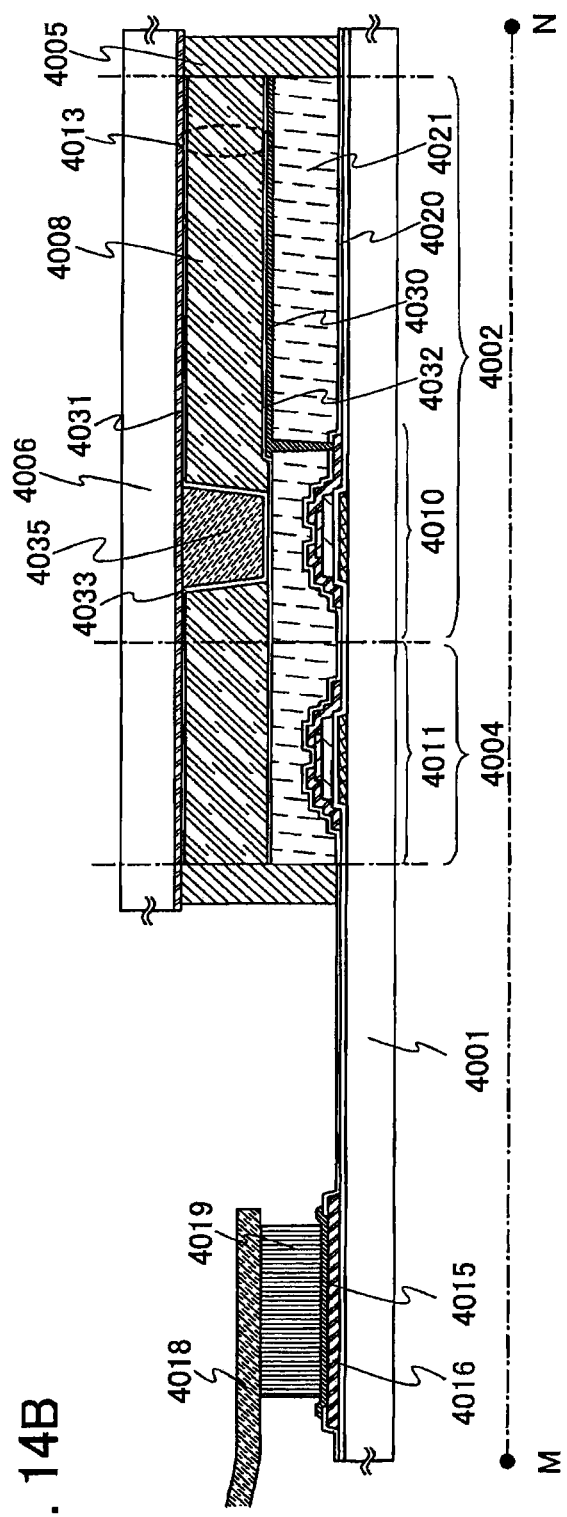

In this embodiment, an example of a liquid crystal display device is described as a semiconductor device including any of the transistors described in Embodiments 1 to 3. The appearance and the cross section of a liquid crystal display panel in the liquid crystal display device are described with reference to FIGS. 14A-1, 14A-2, and 14B. FIGS. 14A-1 and 14A-2 are each a top view of a panel in which thin film transistors 4010 and 4011 which include a semiconductor layer, and a liquid crystal element 4013, which are formed over a first substrate 4001, are sealed between the first substrate 4001 and a second substrate 4006 with a sealant 4005. FIG. 14B corresponds to a cross-sectional view taken along line M-N of FIGS. 14A-1 and 14A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed between the first substrate 4001 and the second substrate 4006 with the sealant 4005. A signal line driver circuit 4003 that is formed using a single crystal semiconductor film or a polycrystalline semiconductor film over a substrate which is prepared separately is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 14A-1 illustrates an example in which the signal line driver circuit 4003 is mounted by a COG method, and FIG. 14A-2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 14B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

Any of the structures described in the above embodiments can be applied to the thin film transistors 4010 and 4011.

A pixel electrode layer 4030 included in the liquid crystal element 4013 is electrically connected to the thin film transistor 4010. A counter electrode layer 4031 included in the liquid crystal element 4013 is formed on the second substrate 4006. A portion where the pixel electrode layer 4030, the counter electrode layer 4031, and the liquid crystal layer 4008 overlap corresponds to the liquid crystal element 4013. Note that the pixel electrode layer 4030 and the counter electrode layer 4031 are provided with insulating layers 4032 and 4033 which function as alignment films, respectively, and the liquid crystal layer 4008 is sandwiched between the pixel electrode layer 4030 and the counter electrode layer 4031 with the insulating layers 4032 and 4033 provided therebetween.

The first substrate 4001 and the second substrate 4006 can be formed using glass, metal (typically, stainless steel), ceramic, or plastic. As for plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by reference numeral 4035 is obtained by selective etching of an insulating film and is provided to control a distance (a cell gap) between the pixel electrode layer 4030 and the counter electrode layer 4031. Note that a spherical spacer may also be used. In addition, the counter electrode layer 4031 is electrically connected to a common potential line provided on the same substrate as the thin film transistor 4010. With the use of a common connection portion, the counter electrode layer 4031 and the common potential line can be electrically connected to each other through conductive particles arranged between a pair of substrates. Note that the conductive particles are included in the sealant 4005.

In addition, liquid crystal exhibiting a blue phase for which an alignment film is unnecessary may be used. The blue phase is one of liquid crystal phases and a phase which appears just before the transition from a cholesteric phase to an isotropic phase when the temperature of cholesteric liquid crystal is increased. Because the blue phase appears only in a small temperature range, a liquid crystal composition in which greater than or equal to 5 wt % of a chiral agent is mixed is used for the liquid crystal layer 4008 in order to improve the temperature range. The liquid crystal composition including liquid crystal exhibiting a blue phase and a chiral agent has a short response time of 10 µs to 100 µs and are optically isotropic; therefore, alignment treatment is unnecessary, and viewing angle dependence is small.

Note that the liquid crystal display device described in this embodiment is an example of a transmissive liquid crystal display device; however, the liquid crystal display device can be applied to either a reflective liquid crystal display device or a semi-transmissive liquid crystal display device.

The liquid crystal display device described in this embodiment is an example in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is also not limited to this embodiment and may be set as appropriate depending on materials of the polarizing plate and the coloring layer or conditions of the manufacturing process. In addition, a light-blocking film which functions as a black matrix may be provided.

In this embodiment, in order to reduce surface unevenness of the thin film transistors and to improve reliability of the thin film transistors, the thin film transistors are covered with the insulating layers (the insulating layer 4020 and the insulating layer 4021) functioning as a protective film or a planarizing insulating film. Note that the protective film is provided to prevent entry of a contaminant impurity such as an organic substance, a metal substance, or moisture floating in the atmosphere and is preferably a dense film. As the protective film, a single layer or a stacked layer of any of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a sputtering method. In this embodiment, an example in which the protective film is formed by a sputtering method is described; however, there is no particular limitation on the method, and a variety of methods may be used.

Here, the insulating layer 4020 having a stacked structure is formed as the protective film. Here, a silicon oxide film is formed by a sputtering method, as a first layer of the insulating layer 4020. When the silicon oxide film is used as the protective film, the silicon oxide film has an effect of preventing a hillock of an aluminum film used as a source electrode layer and a drain electrode layer.

An insulating layer is formed as a second layer of the protective film. Here, a silicon nitride film is formed by a sputtering method, as a second layer of the insulating layer 4020. The use of the silicon nitride film as the protective film can prevent mobile ions of sodium or the like from entering a semiconductor region so that variation in electric characteristics of a TFT can be suppressed.

After the protective film is formed, annealing (greater than or equal to 200° C. and less than or equal to 400° C.) of the semiconductor layer may be performed.

The insulating layer 4021 is formed as the planarizing insulating film. An organic material having heat resistance, such as polyimide, acrylic, benzocyclobutene, polyamide, or epoxy can be used for the insulating layer 4021. In addition to such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

Note that a siloxane-based resin corresponds to a resin formed using a siloxane-based material as a starting material and having the bond of Si—O—Si. As for the siloxane-based resin, an organic group (e.g., an alkyl group or an aryl group) or a fluoro group may be used as a substituent. The organic group may include a fluoro group.

There is no particular limitation on the formation method of the insulating layer 4021, and the following method or tool can be used depending on the material of the insulating layer 4021: a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, or the like. When the insulating layer 4021 is formed using material liquid, annealing (greater than or equal to 200° C. and less than or equal to 400° C.) of the semiconductor layer may be performed in a baking step at the same time. A baking step of the insulating layer 4021 also serves as the annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed using a conductive composition preferably has a light transmittance of greater than or equal to 70% at a wavelength of 550 nm. Further, the resistivity of the conductive high molecule included in the conductive composition is preferably less than or equal to 0.1Ω·cm.

As the conductive high molecule, a so-called π-electron conjugated conductive high molecule can be used. As examples thereof, polyaniline or a derivative thereof, polypyrrole or a derivative thereof, polythiophene or a derivative thereof, and a copolymer of more than two kinds of them can be given.

Further, a variety of signals and potentials are supplied from an FPC 4018 to the signal line driver circuit 4003 which is formed separately, and the scan line driver circuit 4004 or the pixel portion 4002.

In this embodiment, a connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connection terminal electrode 4015 is electrically connected to a terminal included in the FPC 4018 through an anisotropic conductive film 4019.

FIGS. 14A-1, 14A-2, and 14B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

This embodiment can be implemented in appropriate combination with any of the structures described in the other embodiments.

Embodiment 5

Figure 15A:
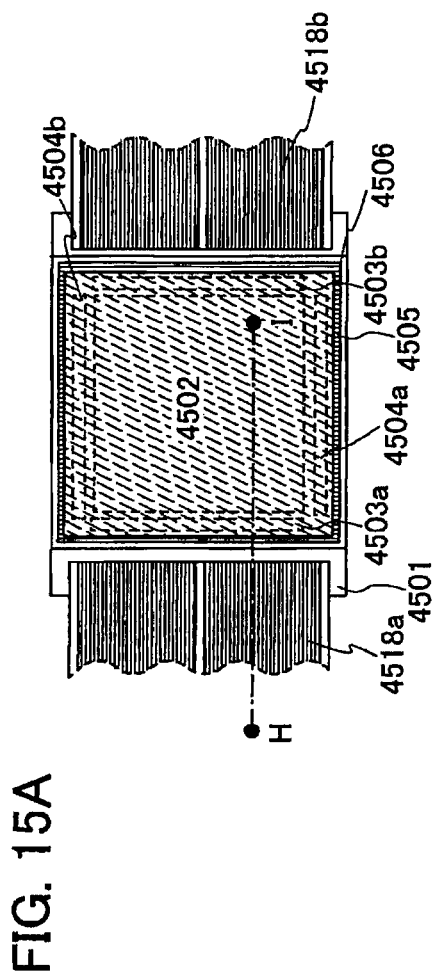
FIGS. 15A and 15B illustrate an example of a semiconductor device according to Embodiment 5.
Figure 15B:
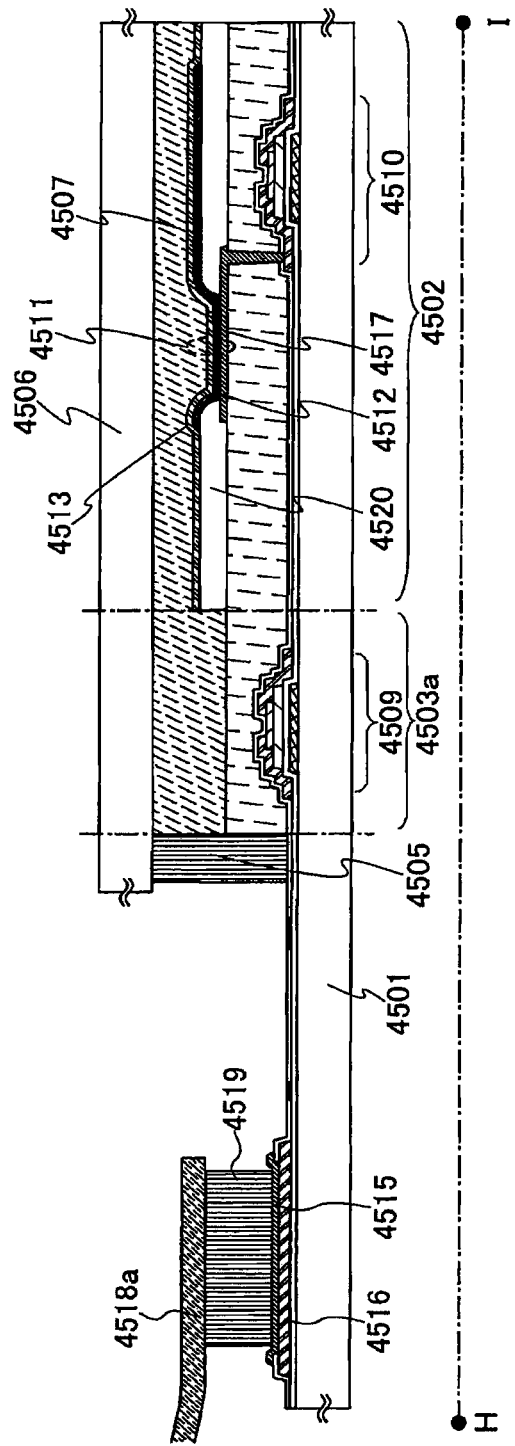

In this embodiment, an example of a light-emitting display device is described as a semiconductor device including any of the transistors described in Embodiments 1 to 3. The appearance and the cross section of a light-emitting display panel (a light-emitting panel) in the light-emitting display device are described with reference to FIGS. 15A and 15B. FIG. 15A is a top view of a panel in which thin film transistors 4509 and 4510 which include a semiconductor layer formed over a first substrate 4501, and a light-emitting element 4511 are sealed between the first substrate 4501 and a second substrate 4506 with a sealant 4505. FIG. 15B corresponds to a cross-sectional view taken along line H-I of FIG. 15A. Note that an example of using an organic EL element as a light-emitting element is described here.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed as well as a filler 4507, between the first substrate 4501 and the second substrate 4506 with the sealant 4505. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors. In FIG. 15B, a thin film transistor 4510 included in the pixel portion 4502 and a thin film transistor 4509 included in the signal line driver circuit 4503a are illustrated.

The thin film transistors 4509 and 4510 can employ any of the structures described in the above embodiments. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked structure of the first electrode layer 4517, the electroluminescent layer 4512, and the second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

The second substrate 4506 located in the direction in which light is extracted from the light-emitting element 4511 should have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, the polarizing plate or the circularly polarizing plate may be provided with an anti-reflection film.

The signal line driver circuits 4503a and 4503b and the scan line driver circuits 4504a and 4504b may be provided by mounting driver circuits formed using a single crystal semiconductor film or a polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 15A and 15B.

Through the above process, a light-emitting display device (a display panel) having high reliability can be manufactured as a semiconductor device.

This embodiment can be implemented in appropriate combination with any of the structures described in the other embodiments.

Embodiment 6

In this embodiment, electronic paper is described as an example of semiconductor devices including transistors.

Figure 16:
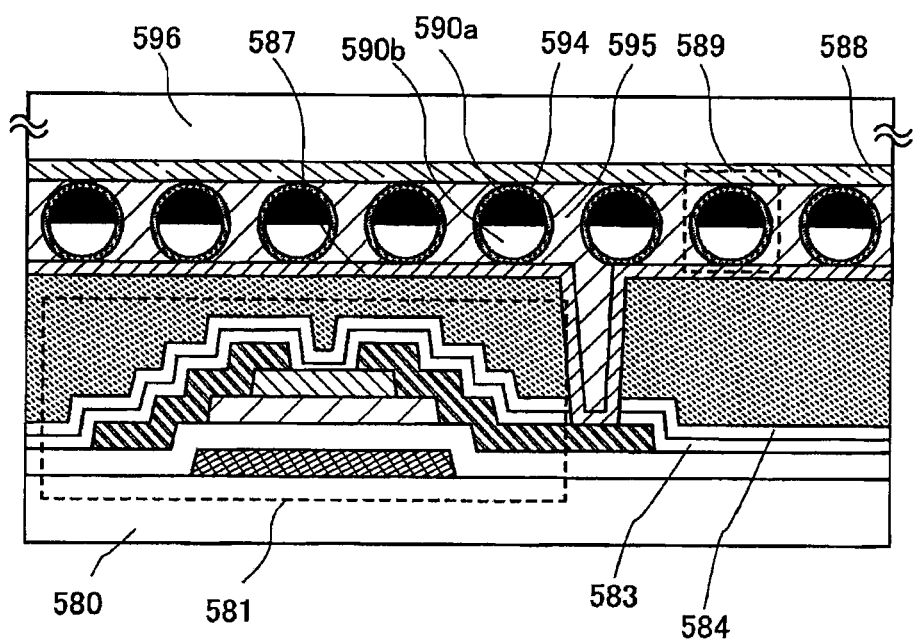
FIG. 16 illustrates an example of a semiconductor device according to Embodiment 6.

FIG. 16 illustrates active matrix electronic paper as an example of the semiconductor device. A thin film transistor 581 used for the semiconductor device can be manufactured in a manner similar to the thin film transistor described in any of Embodiments 1 to 3.

The electronic paper in FIG. 16 is an example of a display device using a twisting ball display system. The twisting ball display system refers to a method in which spherical particles each colored in black and white are arranged between a first electrode layer and a second electrode layer which are used for a display element, and a potential difference is generated between the first electrode layer and the second electrode layer to control orientation of the spherical particles, so that display is performed.

The thin film transistor 581 provided over a substrate 580 has a bottom gate structure. A source electrode layer or a drain electrode layer is electrically connected to a first electrode layer 587 through a contact hole formed in insulating layers 583, 584, and 585. Between the first electrode layer 587 and a second electrode layer 588, spherical particles 589 each including a black region 590a, a white region 590b, and a cavity 594 filled with liquid around the black region 590a and the white region 590b are provided. The circumference of each of the spherical particles 589 is provided with a filler 595 such as a resin (see FIG. 16). In FIG. 16, the first electrode layer 587 corresponds to a pixel electrode, and the second electrode layer 588 corresponds to a common electrode. The second electrode layer 588 is electrically connected to a common potential line provided on the same substrate as the thin film transistor 581. A common connection portion described in the above embodiment is used, whereby the second electrode layer 588 provided on a substrate 596 and the common potential line can be electrically connected to each other through the conductive particles arranged between a pair of substrates.

In that case, a microcapsule having a diameter of approximately 10 µm to 200 µm, in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is called electronic paper in general. Reflectance of the electrophoretic display element is higher than that of a liquid crystal display element, and thus, an assistant light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device including a display device) is distanced from an electric wave source.

In this manner, highly reliable electronic paper can be manufactured as a semiconductor device.

This embodiment can be implemented in appropriate combination with any of the structures described in the other embodiments.

Embodiment 7

In this embodiment, electronic appliances each include any of the display devices described in Embodiments 4 to 6 as part are described.

Examples of electronic appliances each manufactured using any of the transistors described in Embodiments 1 to 3 include cameras such as video cameras and digital cameras, goggle type displays, navigation systems, audio reproducing devices (e.g., car audio component or other audio components), computers, game machines, portable information terminals (e.g., mobile computers, cellular phones, portable game machines, and electronic books), image reproducing devices provided with recording media (i.e., devices that are capable of playing back recording media such as digital versatile discs (DVDs) and equipped with display devices that can display the image), and the like. Specific examples for such electronic appliances are illustrated in FIGS. 17A to 17F.

FIG. 17A illustrates a television set according to one embodiment of the present invention, which includes a housing 9101, a supporting base 9102, a display portion 9103, speaker portions 9104, a video input terminal 9105, and the like. In the display portion 9103 of this television set, transistors similar to those described in any of Embodiments 1 to 3 are arranged in matrix. The transistors also can be applied to a driver circuit or the like in the housing 9101. A television set having high reliability can be obtained with the use of the transistor described in any of Embodiments 1 to 3.

FIG. 17B illustrates a computer according to one embodiment of the present invention, which includes a main body 9201, a housing 9202, a display portion 9203, a keyboard 9204, an external connection port 9205, a pointing device 9206, and the like. In the display portion 9203 of this computer, transistors similar to those described in any of Embodiments 1 to 3 are arranged in matrix. The transistors also can be applied to a driver circuit or the like in the housing 9202. A computer having high reliability can be obtained with the use of the transistor described in any of Embodiments 1 to 3.

FIG. 17C illustrates a cellular phone according to one embodiment of the present invention, which includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, transistors similar to those described in any of Embodiments 1 to 3 are arranged in matrix. The transistors also can be applied to a driver circuit or the like in the main body 9401 or the housing 9402. A cellular phone having high reliability can be obtained with the use of the transistor described in any of Embodiments 1 to 3.

FIG. 17D illustrates a camera according to one embodiment of the present invention, which includes a main body 9501, a display portion 9502, a housing 9503, an external connection port 9504, a remote controller receiving portion 9505, an image receiving portion 9506, a battery 9507, an audio input portion 9508, operation keys 9509, an eye piece portion 9510, and the like. In the display portion 9502 of this camera, transistors similar to those described in any of Embodiments 1 to 3 are arranged in matrix. The transistors also can be applied to a driver circuit or the like in the main body 9501 or the housing 9503. A camera having high reliability can be obtained with the use of the transistor described in any of Embodiments 1 to 3.

FIG. 17E illustrates an example of a digital photo frame. For example, in a digital photo frame 9600, a display portion 9603 is incorporated in a housing 9601. Various images can be displayed on the display portion 9603. For example, the display portion 9603 can display data of an image shot by a digital camera or the like to function as a normal photo frame.

Note that the digital photo frame 9600 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9600. For example, a memory which stores data of an image shot by a digital camera is inserted in the recording medium insertion portion of the digital photo frame, whereby the image data can be downloaded and displayed on the display portion 9603. In the display portion 9603 of this digital photo frame, transistors similar to those described in any of Embodiments 1 to 3 are arranged in matrix. The transistors also can be applied to a driver circuit or the like in the housing 9601. A digital photo frame having high reliability can be obtained with the use of the transistor described in any of Embodiments 1 to 3.

The digital photo frame 9600 may have a configuration capable of wirelessly transmitting and receiving data. Through wireless communication, desired image data can be downloaded to be displayed.

FIG. 17F illustrates a cellular phone 9700 which includes a housing 9701, a display portion 9702, and an operation button 9703. In addition, operations such as making calls and composing mails can be conducted when a person touches the display portion 9702 with his/her finger or the like. In the display portion 9702 of this cellular phone, transistors similar to those described in any of Embodiments 1 to 3 are arranged in matrix. The transistors also can be applied to a driver circuit or the like in the main body in the housing 9701. A digital photo frame having high reliability can be obtained with the use of the transistor described in any of Embodiments 1 to 3.

There are mainly three screen modes of the display portion 9702. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 9702 so that text displayed on a screen can be input. In that case, it is preferable to display a keyboard or number buttons on almost all area of the screen of the display portion 9702.

A detection device including a sensor for detecting inclination, such as a gyroscope or an acceleration sensor, is provided inside the cellular phone 9700, display in the screen of the display portion 9702 can be automatically switched by determining the installation direction of the cellular phone 9700 (whether the cellular phone 9700 is placed horizontally or vertically for a landscape mode or a portrait mode).

The screen modes are switched by touching the display portion 9702 or operating the operation button 9703 of the housing 9701. Alternatively, the screen modes may be switched depending on the kind of the image displayed on the display portion 9702. For example, when a signal of an image displayed on the display portion is a signal of moving image data, the screen mode is switched to the display mode. When the signal is a signal of text data, the screen mode is switched to the input mode.

Further, in the input mode, when input by touching the display portion 9702 is not performed for a certain period while a signal detected by the optical sensor in the display portion 9702 is detected, the screen mode may be controlled so as to be switched from the input mode to the display mode.

The display portion 9702 may function as an image sensor. For example, an image of a palm print, a fingerprint, or the like is taken when the display portion 9702 is touched with a palm or a finger, whereby personal identification can be performed. Further, by providing a backlight or a sensing light source which emits a near-infrared light in the display portion, an image of a finger vein, a palm vein, or the like can be taken.

As described above, the range of application of the semiconductor device according to one embodiment of the present invention is extremely wide, and the semiconductor device can be applied to electronic appliances in various fields.

An electronic appliance having high reliability can be provided with the use of the transistor described in any of Embodiments 1 to 3.

This application is based on Japanese Patent Application serial no. 2009-202449 filed with Japan Patent Office on Sep. 2, 2009, the entire contents of which are hereby incorporated by reference.

The invention claimed is:

1. A semiconductor device comprising:
a gate electrode layer over a substrate;
a gate insulating film over the gate electrode layer;
a semiconductor layer over the gate insulating film, the semiconductor layer overlapping with the gate electrode layer;
a carbide layer containing hydrogen over and in contact with the semiconductor layer;
a source electrode layer electrically connected to the semiconductor layer; and
a drain electrode layer electrically connected to the semiconductor layer.

2. The semiconductor device according to claim 1,
wherein the source electrode layer is over and in contact with the semiconductor layer, and
wherein the drain electrode layer is over and in contact with the semiconductor layer.

3. The semiconductor device according to claim 1, further comprising a first layer and a second layer,
wherein the first layer is interposed between the semiconductor layer and the source electrode layer,
wherein a contact resistance of between the first layer and the source electrode layer is lower than that of between the semiconductor layer and the source electrode layer,
wherein the second layer is interposed between the semiconductor layer and the drain electrode layer, and
wherein a contact resistance of between the second layer and the drain electrode layer is lower than that of between the semiconductor layer and the drain electrode layer.

4. The semiconductor device according to claim 1, further comprising a first layer and a second layer,
wherein the first layer is interposed between the semiconductor layer and the source electrode layer,
wherein a resistance of the first layer is lower than that of the semiconductor layer,
wherein the second layer is interposed between the semiconductor layer and the drain electrode layer, and
wherein a resistance of second layer is lower than that of the semiconductor layer.

5. The semiconductor device according to claim 1,
wherein the carbide layer comprises a material selected from the group consisting of silicon carbide, silicon nitride carbide, germanium carbide, n-type silicon carbide, and p-type silicon carbide.

6. The semiconductor device according to claim 1,
wherein the semiconductor layer includes at least one of indium, zinc, and gallium.

7. The semiconductor device according to claim 1,
wherein the semiconductor layer, the source electrode layer, and the drain electrode layer are covered by the carbide layer.

8. The semiconductor device according to claim 1,
wherein the semiconductor layer includes an oxide semiconductor material.

9. The semiconductor device according to claim 1,
wherein the carbide layer comprises a material selected from the group consisting of silicon nitride carbide, germanium carbide, n-type silicon carbide, and p-type silicon carbide.

10. A semiconductor device comprising:
a gate electrode layer over a substrate;
a gate insulating film over the gate electrode layer;
a semiconductor layer over the gate insulating film;
a source electrode layer electrically connected to the semiconductor layer;
a drain electrode layer electrically connected to the semiconductor layer; and
a carbide layer containing hydrogen in contact with the semiconductor layer, the source electrode layer, and the drain electrode layer.

11. The semiconductor device according to claim 10, further comprising a first layer and a second layer,
wherein the first layer is interposed between the semiconductor layer and the source electrode layer,
wherein a contact resistance of between the first layer and the source electrode layer is lower than that of between the semiconductor layer and the source electrode layer,
wherein the second layer is interposed between the semiconductor layer and the drain electrode layer, and
wherein a contact resistance of between the second layer and the drain electrode layer is lower than that of between the semiconductor layer and the drain electrode layer.

12. The semiconductor device according to claim 10, further comprising a first layer and a second layer,
wherein the first layer is interposed between the semiconductor layer and the source electrode layer,
wherein a resistance of the first layer is lower than that of the semiconductor layer,
wherein the second layer is interposed between the semiconductor layer and the drain electrode layer, and
wherein a resistance of second layer is lower than that of the semiconductor layer.

13. The semiconductor device according to claim 10,
wherein the carbide layer comprises a material selected from the group consisting of silicon carbide, silicon nitride carbide, germanium carbide, n-type silicon carbide, and p-type silicon carbide.

14. The semiconductor device according to claim 10,
wherein the semiconductor layer includes at least one of indium, zinc, and gallium.

15. The semiconductor device according to claim 10,
wherein the semiconductor layer, the source electrode layer, and the drain electrode layer are covered by the carbide layer.

16. The semiconductor device according to claim 10,
wherein the semiconductor layer includes an oxide semiconductor material.

17. The semiconductor device according to claim 10,
wherein the carbide layer comprises a material selected from the group consisting of silicon nitride carbide, germanium carbide, n-type silicon carbide, and p-type silicon carbide.

18. A semiconductor device comprising:
a gate electrode layer over a substrate;
a gate insulating film over the gate electrode layer;
a source electrode layer over the gate insulating film;
a drain electrode layer over the gate insulating film;
a semiconductor layer over the source electrode layer, the drain electrode layer, and the gate electrode layer;
a carbide layer containing hydrogen over and in contact with the semiconductor layer, and
wherein the gate insulating film is interposed between the gate electrode layer and the semiconductor layer.

19. The semiconductor device according to claim 18, further comprising a first layer and a second layer,
wherein the first layer is interposed between the semiconductor layer and the source electrode layer,
wherein a contact resistance of between the first layer and the source electrode layer is lower than that of between the semiconductor layer and the source electrode layer, wherein the second layer is interposed between the semiconductor layer and the drain electrode layer, and wherein a contact resistance of between the second layer and the drain electrode layer is lower than that of between the semiconductor layer and the drain electrode layer.

20. The semiconductor device according to claim 18, further comprising a first layer and a second layer, wherein the first layer is interposed between the semiconductor layer and the source electrode layer, wherein a resistance of the first layer is lower than that of the semiconductor layer, wherein the second layer is interposed between the semiconductor layer and the drain electrode layer, and wherein a resistance of second layer is lower than that of the semiconductor layer.

21. The semiconductor device according to claim 18, wherein the carbide layer comprises a material selected from the group consisting of silicon carbide, silicon nitride carbide, germanium carbide, n-type silicon carbide, and p-type silicon carbide.

22. The semiconductor device according to claim 18, wherein the semiconductor layer includes at least one of indium, zinc, and gallium.

23. The semiconductor device according to claim 18, wherein the semiconductor layer, the source electrode layer, and the drain electrode layer are covered by the carbide layer.

24. The semiconductor device according to claim 18, wherein the semiconductor layer includes an oxide semiconductor material.

25. The semiconductor device according to claim 18, wherein the carbide layer comprises a material selected from the group consisting of silicon nitride carbide, germanium carbide, n-type silicon carbide, and p-type silicon carbide.

* * * * *